(12) United States Patent
Socha

(10) Patent No.: US 6,871,337 B2
(45) Date of Patent: Mar. 22, 2005

(54) ILLUMINATION OPTIMIZATION FOR SPECIFIC MASK PATTERNS

(75) Inventor: Robert John Socha, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 214 days.

(21) Appl. No.: 10/079,829

(22) Filed: Feb. 22, 2002

(65) Prior Publication Data

US 2002/0152452 A1 Oct. 17, 2002

Related U.S. Application Data

(60) Provisional application No. 60/271,305, filed on Feb. 23, 2001.

(51) Int. Cl.[7] .............................................. G06F 17/50
(52) U.S. Cl. ........................... 716/19; 716/20; 716/21; 250/492.22; 250/492.23; 430/5; 430/311; 430/312; 430/313; 359/350
(58) Field of Search ............................... 716/19, 20–21; 359/350, 801, 358, 377; 250/200, 492.22–492.23; 356/233; 430/310, 311–314, 5

(56) References Cited

U.S. PATENT DOCUMENTS

| | | | | |
|---|---|---|---|---|
| 4,631,416 A | * | 12/1986 | Trutna, Jr. | ................... 250/548 |
| 5,512,760 A | * | 4/1996 | Horijon et al. | ........ 250/559.29 |
| 5,644,390 A | * | 7/1997 | Yasuzato | .................... 356/121 |
| 5,654,547 A | * | 8/1997 | Coene et al. | ................ 250/307 |
| 5,680,588 A | | 10/1997 | Gortych et al. | |
| 5,922,513 A | * | 7/1999 | Jeon et al. | ................... 430/311 |
| 5,981,119 A | | 11/1999 | Adams | |
| 5,982,476 A | | 11/1999 | Uematsu | |
| 5,989,764 A | | 11/1999 | Adams | |
| 6,052,626 A | * | 4/2000 | Inui | ........................... 700/121 |
| 6,223,129 B1 | * | 4/2001 | Chan et al. | ................... 702/30 |
| 6,297,876 B1 | * | 10/2001 | Bornebroek | ................. 355/67 |
| 6,335,130 B1 | * | 1/2002 | Chen et al. | ..................... 430/5 |
| 6,338,922 B1 | * | 1/2002 | Liebmann et al. | ............. 430/5 |
| 6,373,553 B1 | * | 4/2002 | Singh | .......................... 355/55 |
| 6,485,891 B1 | * | 11/2002 | Noguchi et al. | ............ 430/311 |
| 6,519,760 B2 | * | 2/2003 | Shi et al. | ....................... 716/19 |
| 6,620,564 B2 | * | 9/2003 | Hung et al. | ................... 430/30 |
| 2001/0035991 A1 | * | 11/2001 | Hobbs et al. | ................ 359/35 |
| 2002/0062206 A1 | * | 5/2002 | Liebchen | ....................... 703/6 |
| 2002/0157081 A1 | * | 10/2002 | Shi et al. | ..................... 716/19 |

OTHER PUBLICATIONS

Fukuda et al. "New approach to resolution limit and advanced image formation techniques in optical lithography" IEEE trans. electron devices vol. 38 No. 1 Jan. 1991 p. 67–75.*

* cited by examiner

*Primary Examiner*—Matthew Smith
*Assistant Examiner*—Granvill D Lee
(74) *Attorney, Agent, or Firm*—Pillsbury Winthrop LLP

(57) ABSTRACT

A method and apparatus for microlithography. The method and apparatus include optimizing illumination modes based on characteristics of a specific mask pattern. The illumination is optimized by determining an appropriate illumination mode based on diffraction orders of the reticle, and the autocorrelation of the projection optic. By elimination of parts of the illumination pattern which have no influence on modulation, excess DC light can be reduced, thereby improving depth of focus. Optimization of mask patterns includes addition of sub-resolution features to reduce pitches and discretize the probability density function of the space width.

16 Claims, 13 Drawing Sheets

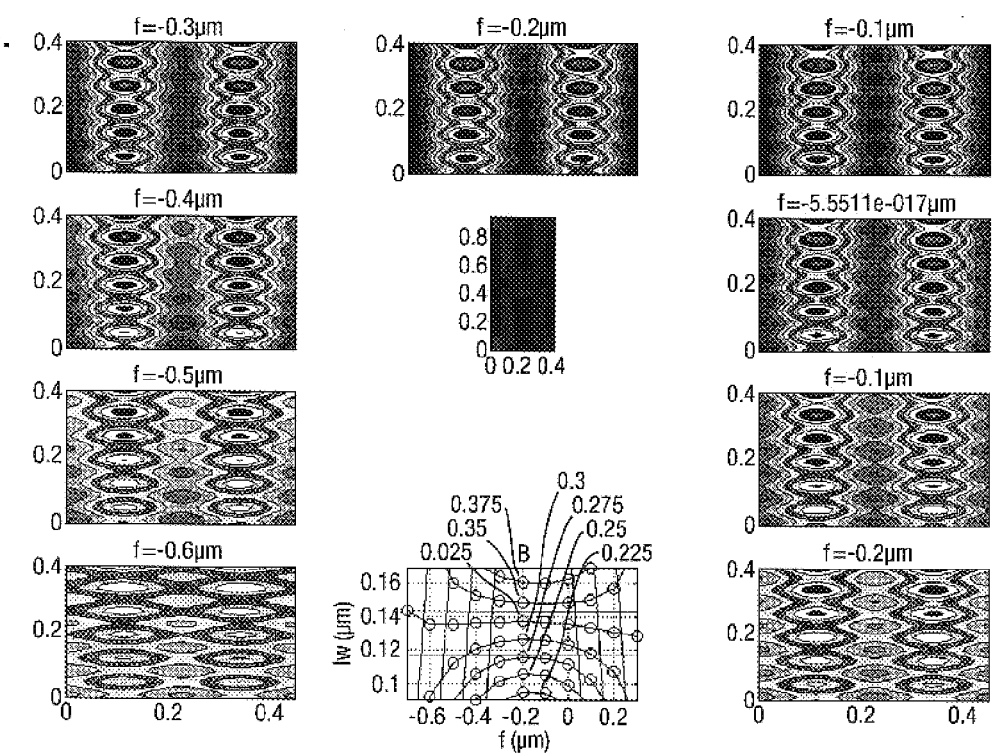

Fig.10.
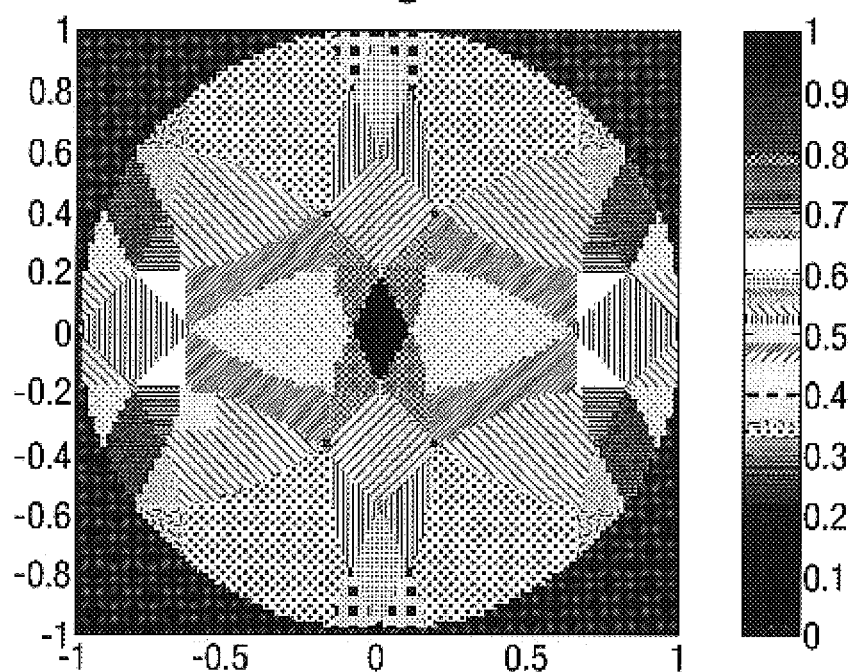
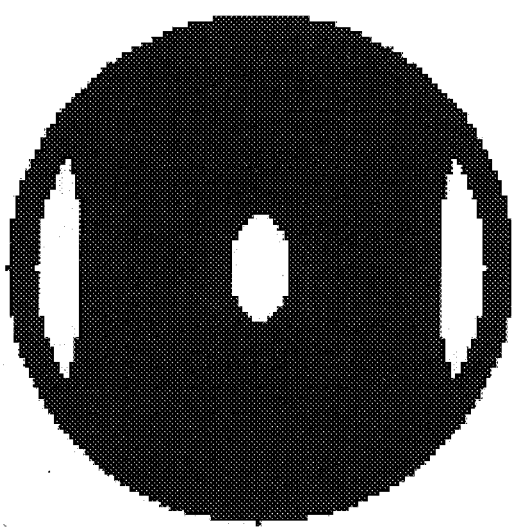
Fig.11a.
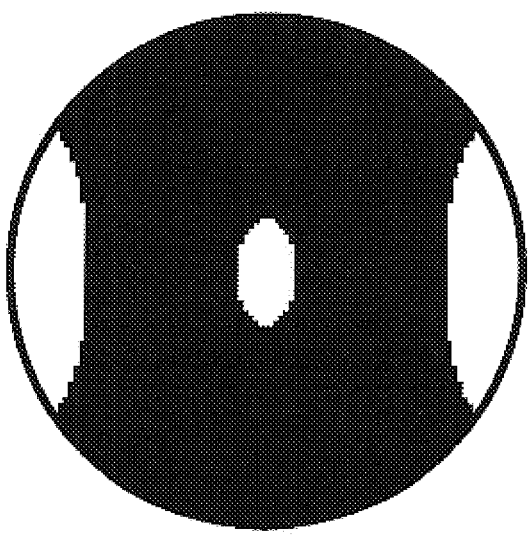
Fig.11b.

ILLUMINATION OPTIMIZATION FOR SPECIFIC MASK PATTERNS

The present invention claims priority from U.S. patent application Ser. No. 60/271,305 filed Feb. 23, 2001, herein incorporated by reference.

BACKGROUND OF THE INVENTION

1. Field of the Invention

This invention relates generally to a method and apparatus for microlithographic imaging. More particularly, it relates to an apparatus and method for optimizing an illumination configuration according to the specific pattern being imaged.

2. Background of the Related Art

Optical lithography systems are in current use in the manufacture of integrated circuits and other fine featured products such as programmable gate arrays. In a most general description, a lithography apparatus includes an illumination system which provides a projection beam of radiation, a support structure which holds a patterning structure, a substrate table which holds a substrate, and a projection system (lens) for imaging the patterned beam onto a target portion of the substrate.

The term patterning structure should be broadly interpreted as referring to devices and structures that can be used to endow an incoming radiation beam with a patterned cross-section, corresponding to a pattern that is to be created in a target portion of a substrate; the term "light valve" has also been used in this context. Generally, the pattern will correspond to a particular functional layer in a device being created in the target portion, such as an integrated circuit or other device.

One example of such a device is a mask, which is generally held by a (movable) mask table. The concept of a mask is well known in lithography, and it includes mask types such as binary, alternating phase-shift, and attenuated phase-shift, as well as various hybrid mask types. Placement of such a mask in the projection beam causes selective transmission (in the case of a transmissive mask) or reflection (in the case of a reflective mask) of the radiation impinging on the mask, according to the pattern on the mask. The mask table ensures that the mask can be held at a desired position in the incoming projection beam, and that it can be moved relative to the beam if so desired.

Another example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

Another example is a programmable LCD array, in which case the support structure can again be a frame or table, for example. An example of such a construction is given in U.S. Pat. No. 5,229,872, which is incorporated herein by reference.

For purposes of simplicity, the rest of this text may, at certain locations, specifically direct itself to examples involving a mask; however, the general principles discussed in such instances should be seen in the broader context of the patterning structure as hereabove set forth.

The term projection system encompasses various types of projection systems. Though "lens" in a layperson's understanding usually connotes only refractive optics, herein this term is used broadly to include catoptric and catadioptric systems, for example. The illumination system may also include elements operating according to any of these principles for directing, shaping or controlling the projection beam, and such elements may also be referred to below, collectively or singularly, as a "lens".

Additionally, the term "wafer table" may be used without implying that the substrate receiving the image is a silicon wafer, but may rather indicate a stage suited for support of any substrate to be processed by the lithography apparatus.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (comprising one or more dies) on a substrate (silicon wafer) that has been coated with a layer of radiation-sensitive material (resist). In general, a single wafer will contain a network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

As illumination systems have evolved from producing conventional to annular, and on to quadrupole and more complicated illumination configurations, the control parameters have concurrently become more numerous. In a conventional illumination pattern, a circular area including the optical axis is illuminated, the only adjustment to the pattern being to alter the outer radius ($\sigma_r$). Annular illumination requires the definition of an inner radius ($\sigma_c$) in order to define the illuminated ring. For multipole patterns, the number of parameters which can be controlled continues to increase. For example in a quadrupole illumination configuration, in addition to the two radii, a pole angle α defines the angle subtended by each pole between the selected inner and outer radii.

Concurrently, mask technology has been evolving as well. Binary intensity masks have given way to phase-shifted masks and other advanced designs. While a binary mask simply transmits, reflects or blocks imaging radiation at a given point, a phase-shifted mask may attenuate some radiation or it may transmit or reflect the light after imparting a phase shift, or both. Phase-shifted masks have been used in order to image features which are on the order of the imaging radiation's wavelength or smaller, since diffraction effects at these resolutions can cause poor contrast and end-of-line errors, among other problems.

The various types of illumination configurations can be used to provide improvements in resolution, depth of focus, contrast and other characteristics of the printed image. However, each illumination type has certain tradeoffs. For example, improved contrast may come at the expense of depth of focus; each type of mask has a performance which is dependent on the pattern to be imaged as well.

Conventionally, in order to select the optimum illumination mode for a given pattern to be imaged onto a wafer, a series of test wafers has been exposed and compared on a hit-or-miss basis. As noted above, modern illumination systems have ever increasing numbers of variables which can be manipulated. As the various permutations of variable settings increase, the cost of trial and error optimization of illumination configurations becomes very large and quantitative methods of selecting illumination configurations are needed.

SUMMARY OF THE INVENTION

To provide for the above identified needs and others, the present invention provides a method of optimizing an illumination profile for a selected patterning structure pattern, including:

defining a transmission cross coefficient function for an optical system including an illuminator and the selected patterning structure pattern;

determining relative relevance to imaging of diffraction orders based on the selected pattern; and calculating an optimized illumination configuration from the transmission cross coefficient function, weighting regions of the illumination configuration based on the relative relevance to imaging of the diffraction orders.

According to another aspect of the present invention there is provided a device manufacturing method including:

(a) providing a substrate that is at least partially covered by a layer of radiation-sensitive material;

(b) providing a projection beam of radiation using an illumination system;

(c) using patterning structure to endow the projection beam with a pattern in its cross-section;

(d) projecting the patterned beam of radiation onto a target portion of the layer of radiation-sensitive material, wherein, prior to step (d), the cross-sectional intensity distribution in the projection beam produced in step (b) is tailored to the pattern employed in step (c) using a method as described above.

According to another aspect of the present invention there is provided a lithographic projection apparatus comprising:

an illumination system for providing a projection beam of radiation;

a support structure for supporting patterning structure, the patterning structure serving to pattern the projection beam according to a desired pattern;

a substrate table for holding a substrate; a projection system for projecting the patterned beam onto a target portion of the substrate, wherein the apparatus additionally comprises:

calculating means, for defining a transmission cross coefficient function for the illuminator and the desired pattern, determining relative relevance to imaging of diffraction orders based on the pattern produced by the patterning structure, and calculating an optimized illumination configuration from the transmission cross coefficient function, weighing regions of the illumination configuration based on the relative relevance to imaging of the diffraction orders;

and selecting means, for selecting the cross-sectional intensity distribution in the projection beam exiting the illumination system in accordance with the illumination configuration calculated by the calculating means.

According to a yet another aspect of the present invention there is provided a method of optimizing a selected mask design comprising:

identifying critical features of the selected mask design;

determining an optimized illumination profile based on diffraction orders of the critical features; and modifying the selected mask design by use of optical proximity correction techniques which are selected to reduce a number of pitches present in the selected mask design.

The present invention further provides computer programs for carrying out the methods described above.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF THE DRAWINGS

The present invention will be described further below with reference to exemplary embodiments and the accompanying drawings, in which:

FIG. 10 is a calculated starting gray scale illumination configuration for the mask feature of FIG. 2 scaled to 110 nm design rules;

FIGS. 11a and 11b are binary representations of the illumination configuration of FIG. 10 with differing values of σ;

In the various Figures, like parts are identified by like references.

DETAILED DESCRIPTION OF THE INVENTION

The present invention involves first mathematically modeling the imaging of the pattern onto the substrate (e.g. from a mask), taking into account the illumination source and the pattern details.

There are two primary methods for calculating the aerial image for a finite illumination source. These methods are Abbe's formulation and Hopkins's formulation. In Abbe's formulation, each point source in the illumination configuration produces a plane wave incident onto the pattern, and each of these point sources is imaged onto the wafer. Since the source is spatially incoherent, the total intensity at the wafer is the summation of the intensity produced by each of these point sources. Therefore, in Abbe's formulation, the integration over the illumination configuration is performed after the integration over the pattern.

In Hopkins's formulation, the order of integration is switched, i.e., the integration over the source is performed first. In Hopkins's formulation, a four dimensional transmission cross coefficient (TCC) is defined, and the image intensity is the inverse Fourier transform of the TCC. A derivation of the TCC is described, for example, in Born and Wolf, *Principles of Optics*, $6^{th}$ Ed., pp. 528–532, herein incorporated by reference.

Figure 1:
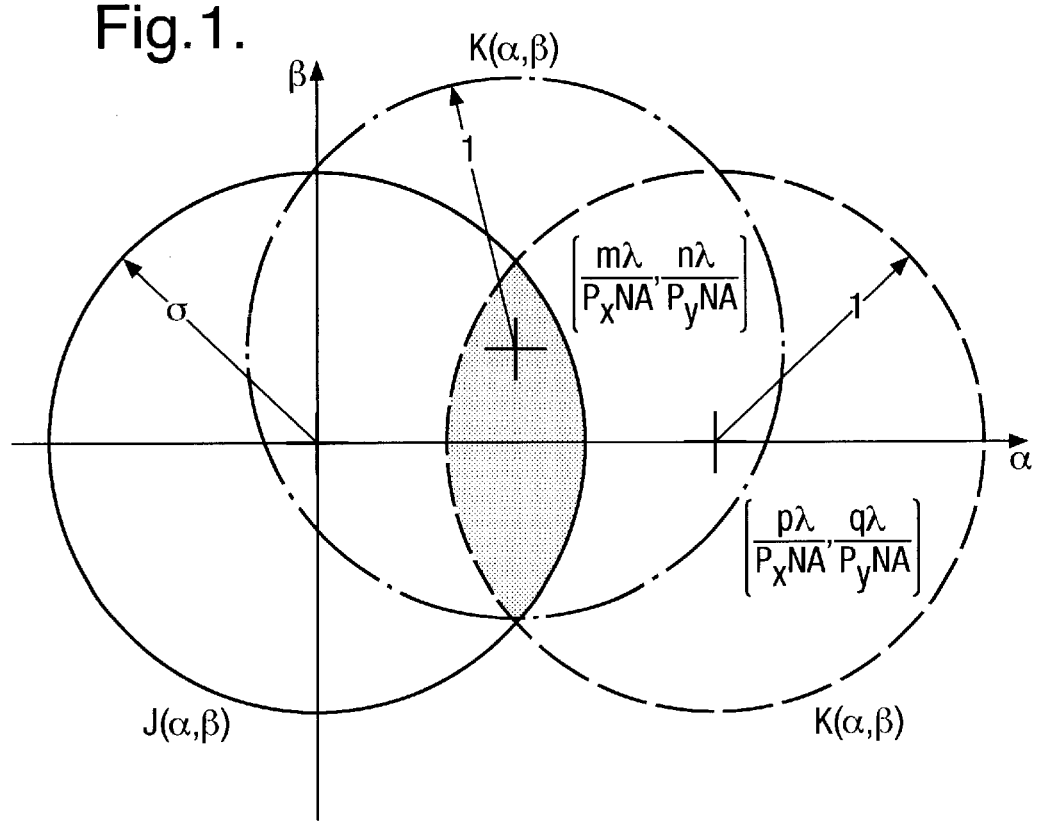
FIG. 1 is a diagram of the transmission cross coefficient function for a generalized image forming system.

The TCC is the autocorrelation of the projection pupil multiplied by the illumination pupil. The TCC is shown in FIG. 1 as a set of three overlapping circles. From left to right, the first circle represents the illumination pupil $J_s(\alpha,\beta)$ where α and β are coordinates of the illumination configuration. For the purposes of the following calculations, the radius of $J_s$ may be, for example, set to the maximum allowable outer $\sigma_r$ for the lithography apparatus which will be used for imaging. It is also possible to set $\sigma_r$ to 1.0 or larger in order to perform feasibility studies and to determine the benefits of a larger $\sigma_r$.

The central circle represents the projection pupil, $K(\alpha,\beta)$ that is centered at $(-m\lambda/P_xNA, -n\lambda/P_yNA)$. The coordinate systems are normalized by a factor of λ/NA so that the radius of K is 1.0. The circle on the right likewise represents the projection pupil; however, it is centered at $(p\lambda/P_xNA, q\lambda/P_yNA)$. In these last two expressions, m,n,p, and q correspond to discrete diffraction orders and it becomes clear that the TCC is a four dimensional (4-D) equation as described above. The diffraction orders in the x-direction are represented by m and p and the diffraction orders in the y-direction are represented by n and q. Though for purposes of this description, x and y coordinates are used, one skilled in the art understands that alternate coordinate systems could be used with appropriate changes of coordinate systems in the following equations.

The TCC for a 4-D discrete point (m,n,p,q) is the integral of the shaded area where all three circles overlap. Since the structure is assumed to be periodic, the Fourier transform of the pattern is discrete and the TCC is discrete. For a continuous pattern image, the pitch can be increased until an adjacent feature has no influence on the Fourier transform of the pattern of interest. The TCC in FIG. 1 is described mathematically in Equation 1.

$$TCC(m, n, p, q) = \iint_{\sqrt{\alpha^2+\beta^2} < \sigma} J_s(\alpha, \beta)$$
$$K\left(\alpha + \frac{m\lambda}{P_x NA}, \beta + \frac{n\lambda}{P_y NA}\right) K^*\left(\alpha - \frac{p\lambda}{P_x NA}, \beta - \frac{q\lambda}{P_y NA}\right) d\alpha d\beta \quad \text{Eqn. 1}$$

The TCC may be expanded to include the effects of the pattern by defining diffraction order cross coefficients (DOCC). The DOCC are defined in Equation 2 which is derived from the multiplication of the TCC by the Fourier transform coefficients of the pattern.

$$DOCC(m, n, p, q) = T(m, n)T^*(-p, -q)TCC(m, n, p, q) \quad \text{Eqn. 2}$$

Further, the radiation intensity at the wafer may be calculated by the inverse Fourier transform of the DOCC, as shown in Eqn. 3.

$$I(x, y) = \sum_m \sum_n \sum_p \sum_q e^{ix\left[\frac{2\pi}{P_x}(m+p)\right]} e^{iy\left[\frac{2\pi}{P_y}(n+q)\right]} DOCC(m, n, p, q) \quad \text{Eqn. 3}$$

The projection optical system acts in part as a low pass filter, which reduces the diffraction orders so that only a few of the diffraction orders are important to the calculated image intensity. As a result, the TCC is a band limited function. The maximum necessary x and y orders can be calculated according to Equations 4 and 5, respectively. In each case, both the negative and positive orders are necessary, for example m extends from negative $m_{max}$ to positive $m_{max}$ ($-m_{max} \leq m \leq +m_{max}$). Since both negative and positive orders are needed, the size of the TCC is $2m_{max}+1$ by $2n_{max}+1$ by $2p_{max}+1$ by $2q_{max}+1$. Fortunately, however, because the TCC is band limited, it is not necessary to calculate all the pattern diffraction orders. Like in the TCC, only pattern diffraction orders $-m_{max} \leq m \leq +m_{max}$ in the x direction and orders $-n_{max} \leq n \leq +n_{max}$ in the y direction are needed.

$$f_{xmax} = m_{max} = p_{max} = \text{floor}\left[\frac{P_x NA(1+\sigma_0)}{\lambda}\right] \quad \text{Eqn. 4}$$

$$f_{ymax} = n_{max} = q_{max} = \text{floor}\left[\frac{P_y NA(1+\sigma_0)}{\lambda}\right] \quad \text{Eqn. 5}$$

Substituting Equations 1 and 2 into Equation 3 gives Equation 6 for the radiation intensity at the wafer. By switching the order of integration, as shown in Equation 7, that is, by using Abbe's formulation rather than Hopkins's, the portions of the illumination pupil which are most influential on imaging may be determined. Note that each of Equations 6 and 7 extends across two lines.

$$I(x, y) = \sum_m \sum_n \sum_p \sum_q e^{ix\left[\frac{2\pi}{P_x}(m+p)\right]} e^{iy\left[\frac{2\pi}{P_y}(n+q)\right]} T(m, n)T^*(-p, -q) \cdot$$
$$\iint_{\sqrt{\alpha^2+\beta^2} < \sigma} J_s(\alpha, \beta) K\left(\alpha + \frac{m\lambda}{P_x NA}, \beta + \frac{n\lambda}{P_y NA}\right) K^*$$
$$\left(\alpha - \frac{p\lambda}{P_x NA}, \beta - \frac{q\lambda}{P_y NA}\right) d\alpha d\beta \quad \text{Eqn. 6}$$

$$I(x, y) = \iint_{\sqrt{\alpha^2+\beta^2} < \sigma} d\alpha d\beta$$
$$\sum_m \sum_n \sum_p \sum_q e^{ix\left[\frac{2\pi}{P_x}(m+p)\right]} e^{iy\left[\frac{2\pi}{P_y}(n+q)\right]} \cdot J_s(\alpha, \beta)$$
$$T(m, n)T^*(-p, -q) K\left(\alpha + \frac{m\lambda}{P_x NA}, \beta + \frac{n\lambda}{P_y NA}\right)$$
$$K^*\left(\alpha - \frac{p\lambda}{P_x NA}, \beta - \frac{q\lambda}{P_y NA}\right) \quad \text{Eqn. 7}$$

Since $\alpha$ and $\beta$ represent illumination pupil coordinates, a new function, $J_{opt}$, may be defined. The new function $J_{opt}$ indicates which part of the illumination configuration $(\alpha, \beta)$ is being used for a given diffraction order $(m,n,p,q)$ and is expressed in Equation 8. From Equation 8, the image intensity can be calculated by multiplying it by the inverse Fourier coefficient ($e^{ikx}$) and summing over all 6 variables $(m,n,p,q,\alpha,\beta)$ as shown in Equation 9.

$$J_{opt}(\alpha, \beta, m, n, p, q) = J_s(\alpha, \beta) T(m, n) T^*(-p, -q)$$
$$K\left(\alpha + \frac{m\lambda}{P_x NA}, \beta + \frac{n\lambda}{P_y NA}\right) K^*\left(\alpha - \frac{p\lambda}{P_x NA}, \beta - \frac{q\lambda}{P_y NA}\right) \quad \text{Eqn. 8}$$

$$I(x, y) = \iint_{\sqrt{\alpha^2+\beta^2} < \sigma} d\alpha d\beta \sum_m \sum_n \sum_p \sum_q e^{ix\left[\frac{2\pi}{P_x}(m+p)\right]} e^{iy\left[\frac{2\pi}{P_y}(n+q)\right]}$$
$$J_{opt}(\alpha, \beta, m, n, p, q) \quad \text{Eqn. 9}$$

As will be appreciated, $J_{opt}$ is a six dimensional function and it is therefore difficult to apply it to the illumination configuration. In order to best determine which portions of the illumination configuration are significant to image formation, it is desirable to eliminate a few of the six variables.

The aerial image intensity, $I(x,y)$, is found by taking an inverse transform over $m+p$ and $n+q$. When $m+p=n+q=0$, there is no modulation in the aerial image intensity. Since one of the goals of illumination optimization is to eliminate parts of the illumination configuration that have little or no influence on modulation, those portions of the illumination configuration for which $m+p=n+q=0$ may be eliminated. In order to eliminate these parts and to better visualize the illumination configuration portions significant to image formation, a transformation of variables will eliminate two of the variables in the six dimensional $J_{opt}$ function (four diffraction orders) and convert it into a four dimensional function (two diffraction orders). The four dimensional function is called $J_{opt-2D}$. By substituting Equations 10 and 11 into Equation 9 for $I(x,y)$, Equation 12 may be derived.

$$\eta = m+p \Rightarrow p = \eta - m \quad \text{Eqn. 10}$$

$$\xi = n+q \Rightarrow q = \xi - n \quad \text{Eqn. 11}$$

$$I(x, y) = \iint\limits_{\sqrt{\alpha^2+\beta^2}<\sigma} d\alpha d\beta \sum_{\eta=-2f_{x\max}}^{+2f_{x\max}} \sum_{\xi=-2f_{y\max}}^{+2f_{y\max}} e^{ix\left[\frac{2\pi}{P_x}\eta\right]} e^{iy\left[\frac{2\pi}{P_y}\xi\right]} \qquad \text{Eqn. 12}$$

$$\underbrace{\sum_{m=-f_{x\max}}^{+f_{x\max}} \sum_{n=-f_{y\max}}^{+f_{y\max}} J_{opt}(\alpha, \beta, m, n, \eta-m, \xi-n)}_{J_{opt-2D}(\alpha,\beta,\eta,\xi)}$$

In Equation 12, $J_{opt-2D}$ can be seen to be the summation of $J_{opt}$ over m and n after the transformation of variables according to Equations 10 and 11. By further substituting Equation 8 into Equation 12, $J_{opt-2D}$ may be expressed as in Equation 13 and the intensity, $I(x,y)$, can be written as a function of $J_{opt-2D}$ as in Equation 14.

$$J_{opt-2D}(\alpha, \beta, \eta, \xi) = \qquad \text{Eqn. 13}$$

$$J_s(\alpha, \beta) \sum_{m=-f_{x\max}}^{+f_{x\max}} \sum_{n=-f_{y\max}}^{+f_{y\max}} T(m, n) T^*[-(\eta-m), -(\xi-n)] \cdot K$$

$$\left(\alpha + \frac{m\lambda}{P_x NA}, \beta + \frac{n\lambda}{P_y NA}\right)$$

$$K^*\left(\alpha - (\eta-m)\frac{\lambda}{P_x NA}, \beta - (\xi-n)\frac{\lambda}{P_y NA}\right)$$

$$I(x, y) = \iint\limits_{\sqrt{\alpha^2+\beta^2}<\sigma} d\alpha d\beta \qquad \text{Eqn. 14}$$

$$\sum_{\eta=-2f_{x\max}}^{+2f_{x\max}} \sum_{\xi=-2f_{y\max}}^{+2f_{y\max}} e^{ix\left[\frac{2\pi}{P_x}\eta\right]} e^{iy\left[\frac{2\pi}{P_y}\xi\right]} J_{opt-2D}(\alpha, \beta, \eta, \xi)$$

The function, $J_{opt-2D}$, when evaluated, shows those portions of the illumination configuration that are important for each diffraction order. Since $J_{opt-2D}$ is weighted by each diffraction order, $T(m,n)$, large diffraction orders will have a greater influence on the aerial image.

A starting point for the best illumination configuration for a particular pattern may be denoted $J_{tot}$ and is found by summing $J_{opt-2D}$ over $\eta$ and $\xi$ and subtracting $J_{opt-2D}(\alpha,\beta,\eta=0,\xi=0)$ as shown in Equation 15. In Equation 15, when $\eta=0$ and $\xi=0$ there is no modulation in the aerial image and the $J_{opt-2D}(\alpha,\beta,\eta=0,\xi=0)$ component represents zero order or DC light. Points in the illumination that do not contribute to imaging increase the overall amount of DC light. Since the increased DC light causes no modulation it is not of great benefit, and moreover it can result in a reduction in depth of focus.

Thus, an illumination configuration in accordance with $J_{tot}$ minimizes the amount of DC light and results in an improved process window. The equation $J_{tot}$ can be used to show which parts of the illuminator are more significant (or less significant) to image formation.

$$J_{tot}(\alpha, \beta) = \qquad \text{Eqn. 15}$$

$$\left[\sum_{\eta=-2f_{x\max}}^{+2f_{x\max}} \sum_{\xi=-2f_{y\max}}^{+2f_{y\max}} |J_{opt-2D}(\alpha, \beta, \eta, \xi)|\right] - |J_{opt-2D}(\alpha, \beta, 0, 0)|$$

Since the illumination configuration and pattern are coupled, optical proximity correction (OPC) changes influence the diffraction orders, which therefore influences $J_{tot}$. Consequently, modifications to the starting illumination configuration, $J_{tot}$, and the pattern should be performed a few times using iterations of processing with an OPC engine and an illumination engine, as will be understood by one skilled in the art. Furthermore, the pattern and illumination configuration also need to be adjusted to optimize a particular imaging criteria (depth of focus (DOF), end of line (EOL), aberration sensitivity, etc.) which may be performed with optimization software. However, since the pattern as a whole, rather than the OPC features, has the largest impact on the optimal illumination configuration, $J_{tot}$ is the best initial illumination configuration to lead to the fastest convergence for optimizing iterations over the illumination configuration and pattern.

The starting illumination configuration, $J_{tot}$, may be represented by a gray scale illumination configuration having continuous values of intensity over a 0 to 1 range. It is possible to create such a gray scale illumination configuration with a diffractive optical element (DOE) or by using a quartz plate with dithered chromium plating. If a gray scale illumination configuration is not possible or preferred, the illuminator profile can be forced to be only 0 and 1 by applying a threshold to the gray scale, in which values above the threshold are rounded up to 1 and values below the threshold are rounded down to 0. An arbitrary threshold can be applied, or an optimal threshold may be found through simulating the process window, or by repeated test runs.

Example 1

Figure 2:
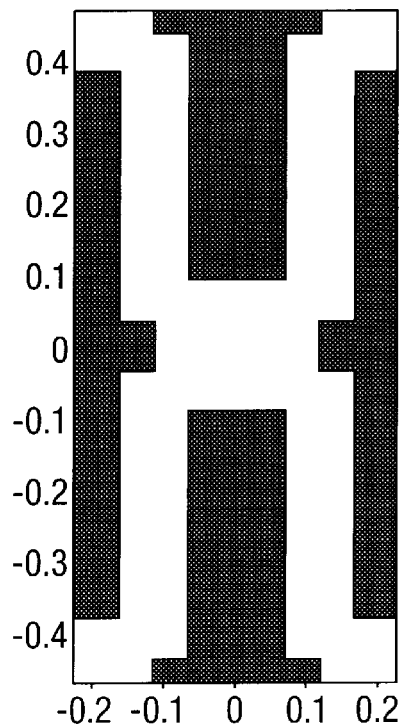
FIG. 2 is an example of a brick wall isolation pattern microlithographic mask feature.

The technique for calculating $J_{tot}$ outlined above was applied to a brick wall isolation pattern. A 150 nm pattern was shrunk to 130 nm and 110 nm design rules and imaged with a step and scan lithography system having a numerical aperture (NA) of 0.8. The isolation pattern for the 130 nm design rule is shown in FIG. 2.

Figure 3:
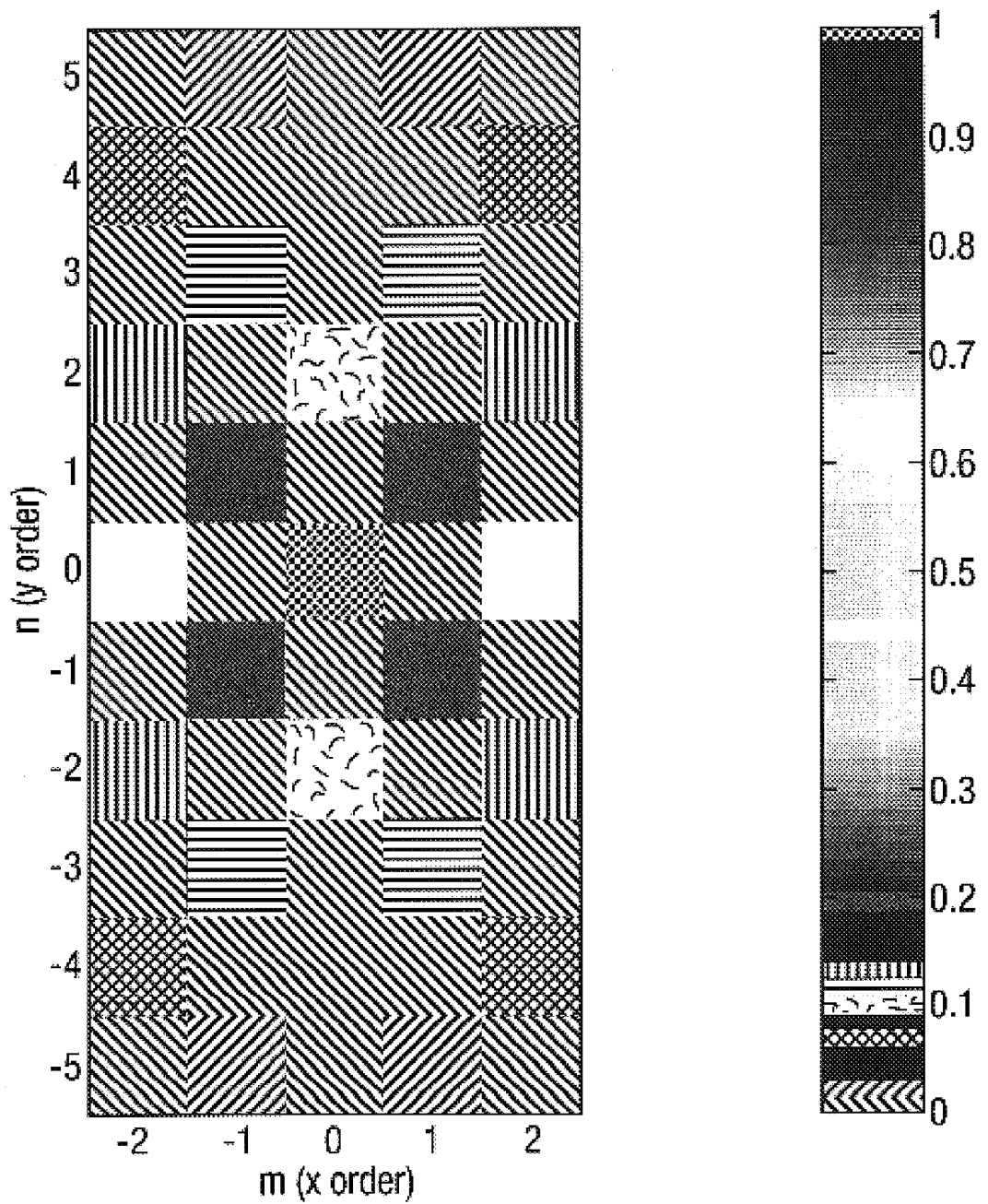
FIG. 3 is a representation of the diffraction orders of the mask feature of FIG. 2.

The magnitudes of the diffraction orders of this mask feature are plotted in FIG. 3. In FIG. 3, the largest order is the (0,0) order or the DC background light. The orders that contribute the most to imaging are the (±2,0) orders and represent the vertical bricks in the brick wall pattern. The other significant order is the (±1,±1) which represents the clear areas and defines the end of the isolation pattern. The higher orders also help to define two dimensional structures such as the end of each line. Since the diffraction orders are not constant, the orders change the weighting coefficients in the DOCC, which implies that the mask pattern influences the illumination strategy.

Figure 4:
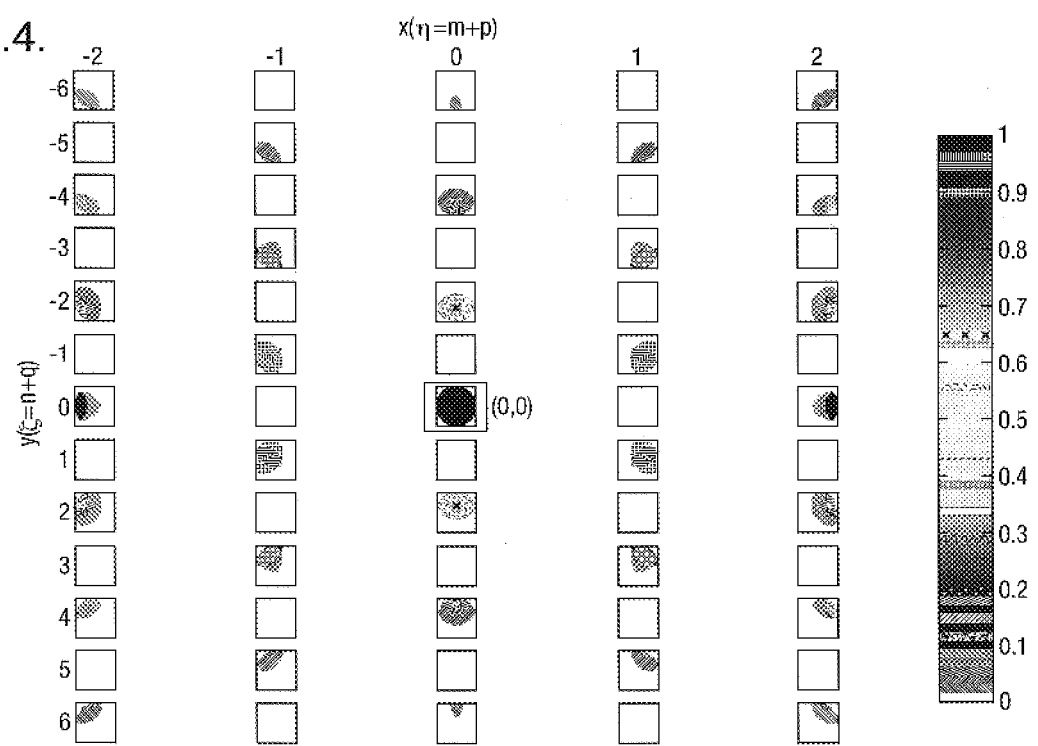
FIG. 4 is a map of the calculated optimized four dimensional illumination configuration for the mask feature of FIG. 2.

The diffraction order coefficients $T(m,n)$ in FIG. 3 can be substituted into Equation 13 to calculate $J_{opt-2D}$ and are plotted in FIG. 4. As can be seen from FIG. 4, the largest contribution to $J_{opt-2D}$ is the ($\eta=0,\xi=0$) order. The (0,0) order does not contribute to imaging and decreases the DOF. As Equation 15 shows, this (0,0) order can be subtracted from the total illumination, $J_{tot}$. Not considering the (0,0) order, the largest contribution is the ($\eta=\pm 2,\xi=0$) diffraction order, which represents the formation of the isolation lines along the x-direction. Another component that is large and defines the end of the isolation lines is the ($\eta=\pm 1,\xi=\pm 1$) diffraction order. Although the (0,±2) diffraction order is rather small, higher orders combine in the $\eta=0$ and $\xi=\pm 2$ region of the lens. These regions also help to define the end of line. The DOCC approach shows how the illumination pupil is sampled for improved image formation and is an effective method for understanding imaging of the brick wall isolation pattern.

Figure 5:
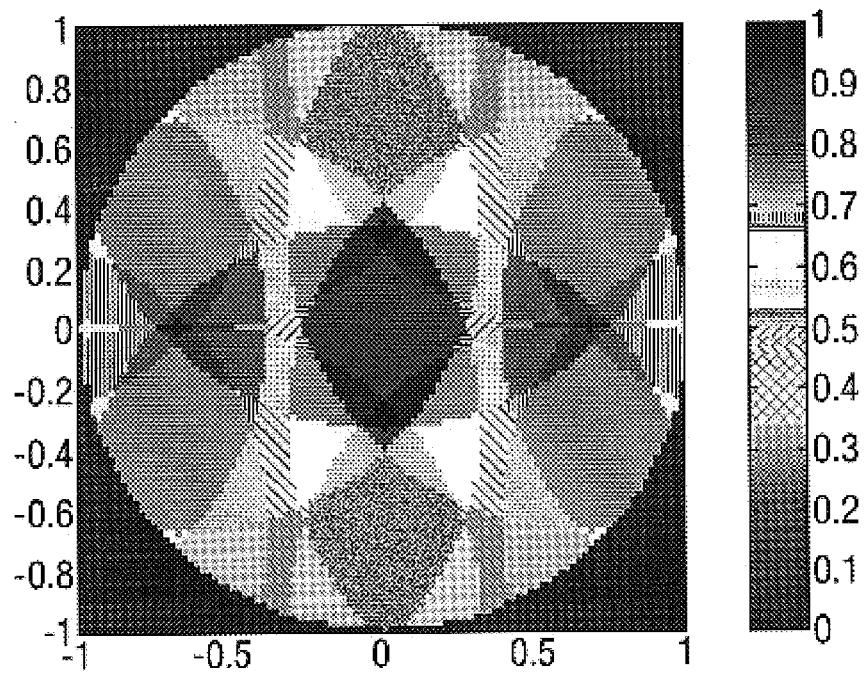
FIG. 5 is a calculated starting gray scale illumination configuration ($J_{tot}$) for the mask feature of FIG. 2.

Using Equation 15, the illumination pupil of the brick wall pattern for the 130 nm design rule can be calculated and is shown in FIG. 5. FIG. 5 shows that the most significant areas for image formation are the outer portions of the illumination configuration along the x-axis. These outer portions form an elliptical dipole. In addition to these elliptical dipole elements, the center of the illumination pupil has a large contribution to image formulation. As noted above, the illumination pupil can be implemented in gray scale or binary illumination profiles.

Depending on the apparatus being used, gray scale illumination may be possible. By gray scale illumination is meant controllable illumination intensity for which a normalized level ranging from 0 to 1 may be selected for at least given portions of the illumination configuration. For example, such control over illumination intensity may be produced by use of a diffractive optical element (DOE) in the illumination system. In this case, for example, the illumination configuration can be implemented as shown in FIG. 5. However, some of the local spikes which are calculated in theory and seen in FIG. 5 will be removed after low pass filtering of the illumination information as a result of the projection optics, as discussed above. Therefore, when designing an illumination configuration, spikes which will be filtered should be ignored.

If a binary illumination configuration is used, i.e., only binary values for intensity of the illuminator are allowed (0 or 1), a threshold value should be chosen as a basis for assigning values of 0 or 1 to each point on the illumination configuration. For example, if a threshold of 0.8 is chosen, illuminator intensity values above 0.8 are rounded up to 1 and values below 0.8 are rounded down to 0. Other threshold values may be applied as desired.

Example 2

Figure 6:
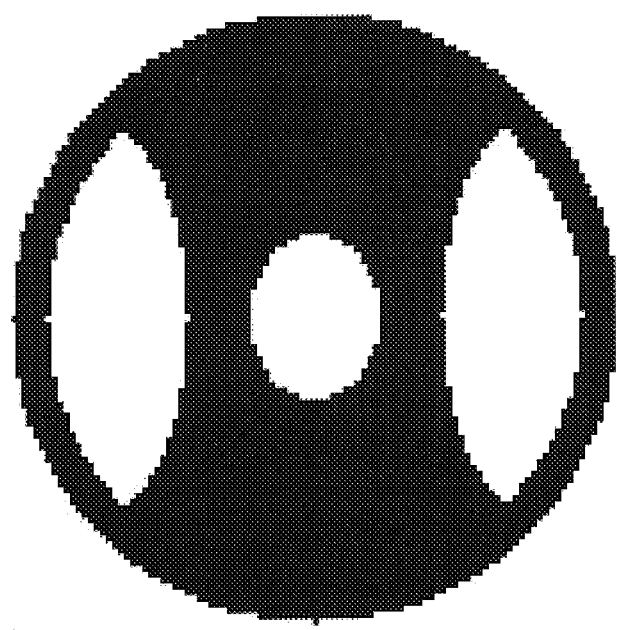
FIG. 6 is a binary representation of the illumination configuration of FIG. 5.

Using the gray scale to binary approach, a binary illumination configuration for the same brick wall isolation pattern was designed assuming a maximum outer σ of 0.88 and is shown in FIG. 6.

Figure 7:
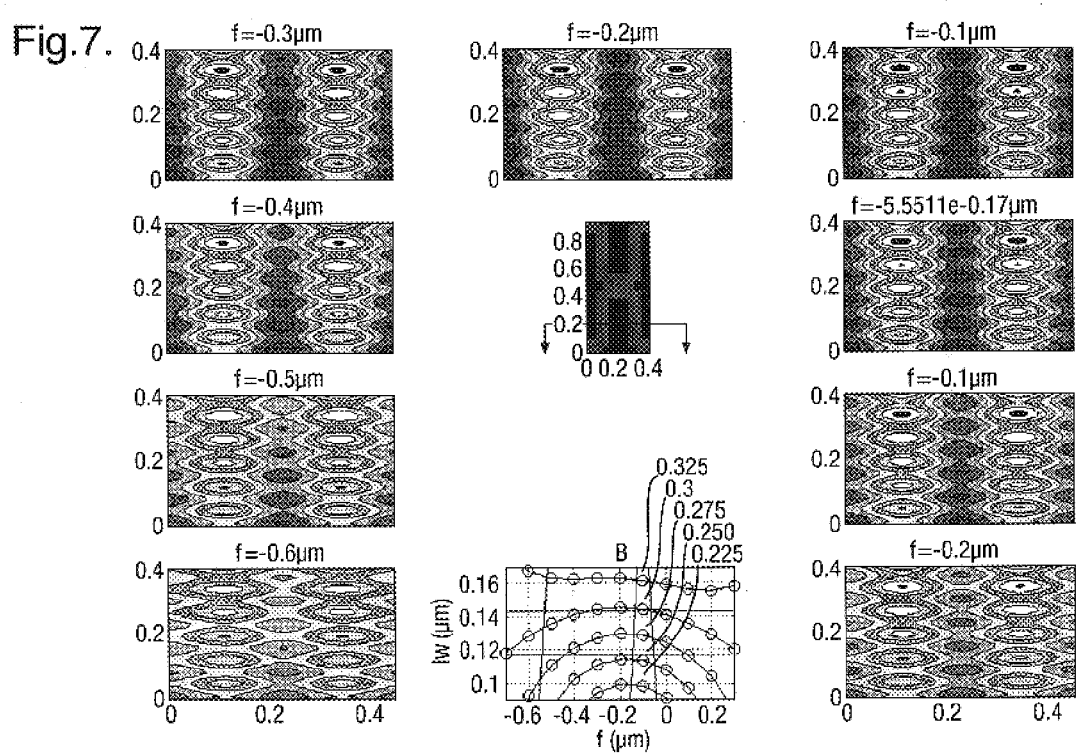
FIG. 7 shows analysis of a print of the mask feature of FIG. 2 printed with an annular illumination configuration.
Figure 7:
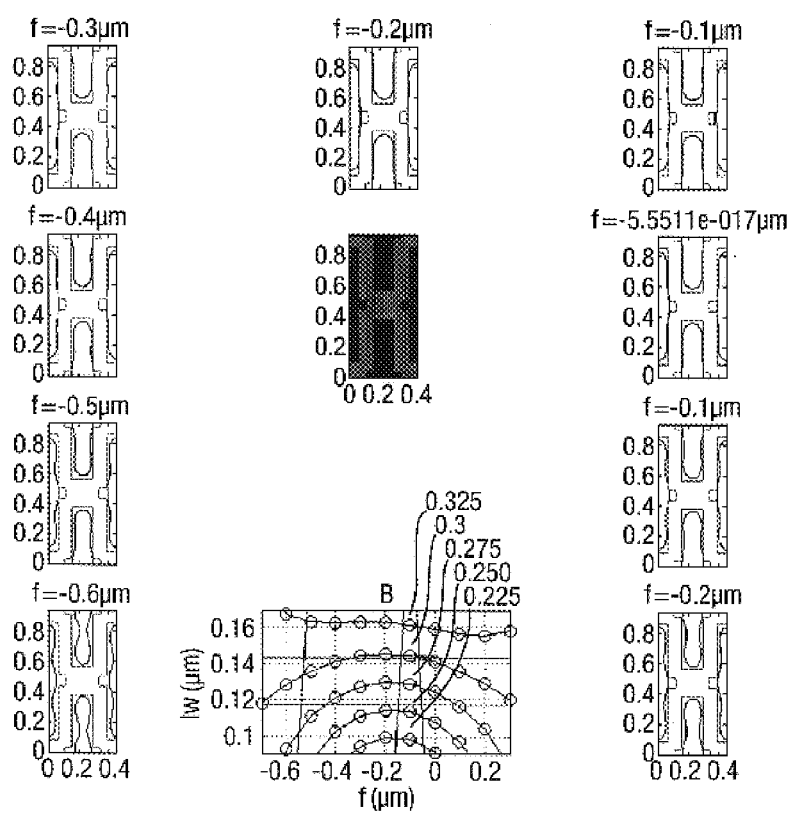
Figure 8:
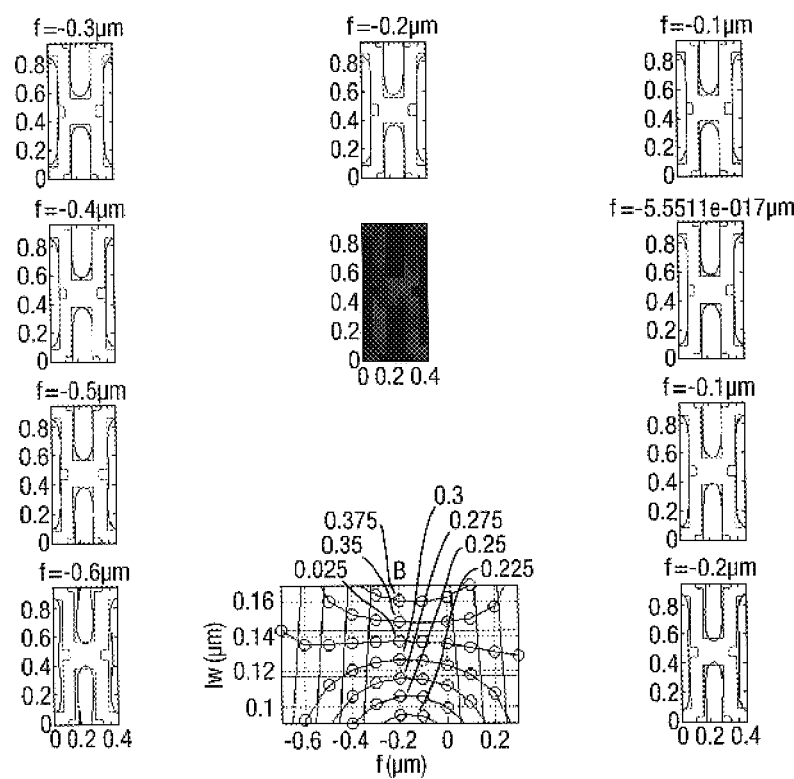
FIG. 8 shows analysis of a print of the mask feature of FIG. 2 printed with an optimized elliptical illumination configuration.
Figure 8:
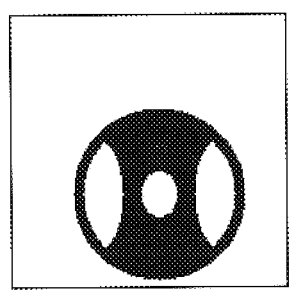

The performance of the optimized illumination configuration in FIG. 6 was then simulated for binary mask on a step and scan photolithography apparatus having NA=0.8 and λ=248 nm and compared to the simulated performance of annular illumination. In the simulation, the vector (thin-film) imaging resist model was used since the numerical aperture was above 0.7. In this model, the resist is 400 nm thickness of a type having a refractive index n=1.76−j0.0116), over 66 nm of another type having n=1.45−j0.3 on top of a polysilicon material having n=1.577−j3.588. The results with the annular illumination ($\sigma_{in}$=0.58 and of $\sigma_{out}$=0.88) and with the optimized illuminator ($\sigma_{out}$=0.88) are shown in FIGS. 7 and 8, respectively. In both FIGS. 7 and 8, cross section results in the middle of the isolation region and top down simulation results are shown. In the figures, the Bossung plot B from aerial image threshold is calculated by averaging the intensity through the resist, and the resultant linewidth, lw, is plotted versus focus, f, for a threshold intensity. This technique tends to over predict the DOF as thickness loss and resist profile slope is not taken into consideration. A resist model that at least calculates thickness loss is probably necessary. In each of the figures, the top down results are plotted as solid, curved lines at the best threshold (best dose) as calculated by the Bossung plot. These simulated threshold images are compared to actual mask data shown in dashed, straight lines.

Simulation results for the 130 nm design rule brick wall isolation pattern are plotted in FIG. 7 for a binary mask feature with NA of 0.8 using annular illumination ($\sigma_{in}$=0.58 and of $\sigma_{out}$=0.88). This annular setting has approximately 0.4 μm of DOF from −0.4 μm to 0.0 μm focus. The contrast of the resist is low through focus, and can be imaged with a low contrast resist. However, at this low intensity contrast, the mask error enhancement factor (MEEF) is large and the exposure latitude (EL) is small. The top down images in FIG. 7 also show that there is approximately 20 nm of end of line (EOL) shortening, which can be fixed by extending the line slightly for the 130 nm design rule. However, as the design rule continues to shrink, extending the line is no longer feasible as the extended line may conflict with other features. Therefore, it is desirable to fix the EOL with the illumination.

In FIG. 8, simulation results for the 130 nm design rule brick wall isolation pattern are plotted for a binary mask feature with NA of 0.8 and using the optimized binary illumination configuration in FIG. 6. The optimal illumination configuration has approximately 0.6 μm DOF from −0.45 μm to +0.15 μm focus. In comparing the cross section images in FIG. 8 to those in FIG. 7, the optimized illumination configuration has a larger contrast through focus as compared to annular illumination. This larger contrast implies that the MEEF for the optimized illumination configuration is lower compared to annular illumination and that the exposure latitude for the optimized illumination configuration is higher. Another benefit of the optimized illumination configuration is the improved line end performance as compared to annular illumination. The top down images in FIG. 8 show that the optimized illumination configuration is capable of maintaining the EOL without extending the line on the pattern, which may be advantageous for more aggressive design rule shrinks.

Example 3

The results in FIGS. 7 and 8 for binary mask (BIM) were compared to simulation results for chromeless mask (CLM). A chromeless brick wall isolation pattern was designed from experimental results of software simulation in a manner known to those skilled in the art. The chromeless technology requires (0,0) order light so as to fully benefit from the DOF improvement produced by off axis illumination. Experimental results from the simulation confirm the need for (0,0) order light for which purpose the isolation layer should be dithered or half toned. The half tone pitch may be chosen such that the first order in the dithered direction does not fall into the projection pupil. In the example, the lines were dithered in the vertical direction with pitch less than λ/[NA (1+$\sigma_{out}$). The dithering duty cycle however should be tuned to optimize the amount of (0,0) order light for best DOF and pattern fidelity. In the simulation results for CLM the half tone pitch was 155 nm with 50% duty cycle (77.5 nm chrome islands). This pitch substantially prevented the (0,±1) orders from entering the projection pupil; however, this duty cycle should be tuned to maximum DOF with computer aided design tools.

Example 4

Simulation results for the 130 nm design rule layer were plotted for a CLM with 155 nm halftone pitch and 50% duty cycle. The CLM was exposed on a λ=248 nm apparatus with NA of 0.8 and annular illumination ($\sigma_{in}$=0.58 and $\sigma_{out}$=0.88). The CLM with this annular setting had 0.5 μm DOF (−0.4 μm focus to +0.1 μm focus). The CLM with annular illumination had greater DOF and better contrast through focus as compared to BIM with annular illumination. This indicates that the CLM performed better than the BIM mask.

The top down simulation results indicated that the EOL performance with CLM is theoretically better than the EOL performance with BIM and that the CLM was also able to better define the contact hole landing area as compared to BIM.

Example 5

Simulation results for 130 nm brick wall isolation pattern isolation layer were plotted for $\lambda$=248 nm apparatus with NA of 0.8 and the optimized elliptical dipole shown in FIG. 6. These results were simulated with a reticle identical to the CLM reticle used in the preceding example, which has a 155 nm halftone pitch and 50% duty cycle. The CLM exposed with this optimized illumination configuration had 0.7 $\mu$m DOF (−0.5 $\mu$m to +0.2 $\mu$m), an improvement of 40%. The Bossung plots indicated that the isofocal intensity was around 0.21. A model based OPC approach could additionally be applied in order to tune the reticle to size at the correct linewidth, providing further improvements in performance. The linewidth may be corrected, for example, by biasing and by modifying the half tone duty cycle. The top down simulation results indicated that CLM was able to define the contact landing region and was able to maintain CD uniformity. Necking and other linewidth inconsistencies were reduced with this elliptical illumination configuration. Furthermore, the CLM reticle could be biased to improve the DOF, and consequently the EOL performance should improve. Furthermore, model based OPC should be able to correct the EOL further.

Example 6

Figure 9:
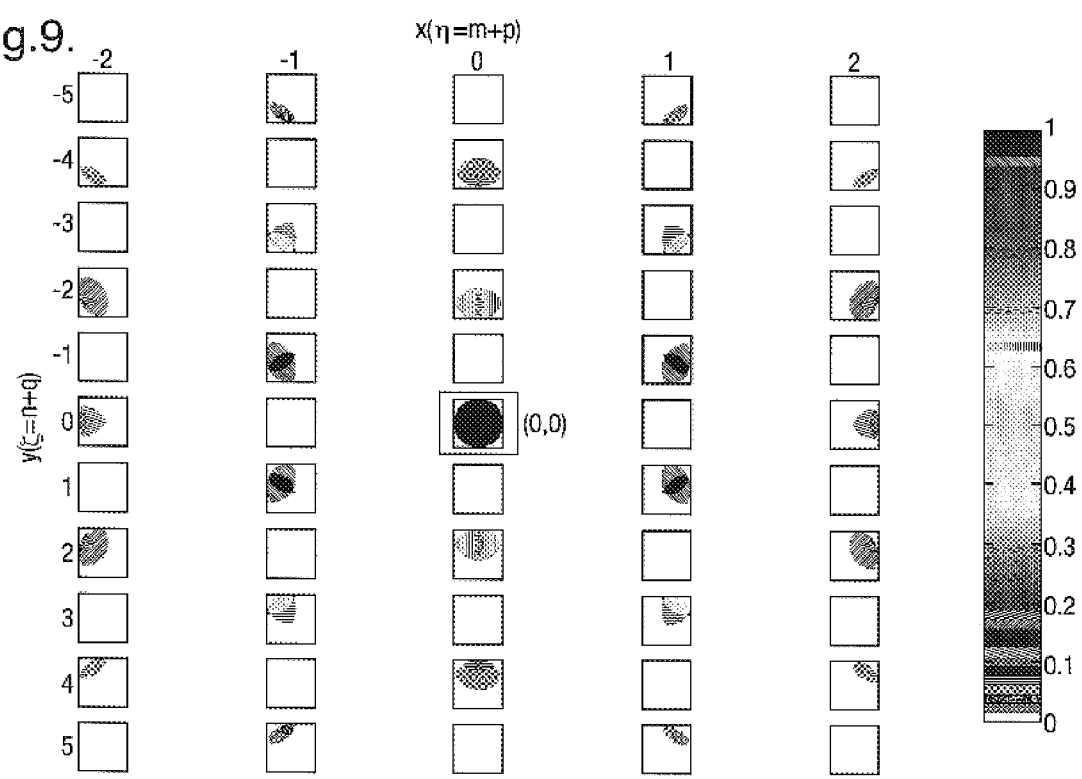
FIG. 9 is a map of the calculated optimized four dimensional illumination configuration for the mask feature of FIG. 2 scaled to 110 nm design rules.

Using the mask pattern of FIG. 2 for a 110 nm design rule isolation layer, an optimized illumination configuration was generated with Equations 13 and 15. In order to visualize sampling of the illumination pupil, $J_{opt\text{-}2D}$ is plotted in FIG. 9, showing x orders ($\eta$=m+p) horizontally and y orders ($\xi$=n+q) vertically. As in FIG. 4 for the 130 nm design rule, the largest contribution to 110 nm design rule in FIG. 11 is the ($\eta$=0, $\xi$=0) order. This (0,0) order light is detrimental to the DOF and is eliminated in $J_{tot}$ as indicated in Equation 15. FIG. 9 also shows that the (±1,±1) orders are the largest contributors to the illumination configuration optimization rather than the (±2,0) order. This is due to the fact that 110 nm design rule is considered by some to be too aggressive for the 248 nm apparatus with NA=0.8, as slightly higher NA may be used to achieve this resolution. The orders that contribute most to defining the isolation linewidth are the (±2,0) orders. The (±2,0) orders, however, are at the far edge of the illumination configuration (0.8<$\sigma$<1.0), which indicates that $\sigma$ of 1 may provide improvement to implement the 110 nm design rule at this wavelength.

Using Equation 15 and the results in FIG. 9, the optimized illumination configuration for the 110 nm brick wall isolation layer is shown in FIG. 10. FIG. 10 shows that the illumination configuration areas that contribute most to image formation are a small portion in the center and far edges of the illumination configuration. One possible implementation of this illumination configuration is plotted in FIG. 11*a*. In order to use 248 nm apparatus to print more aggressive design rules and push the limit of the projection numerical aperture, an illumination configuration with $\sigma$ of 1.0, as shown in FIG. 11*b*, and with small sectors ($\sigma$ ring width of 0.2) may be used.

Figure 12:
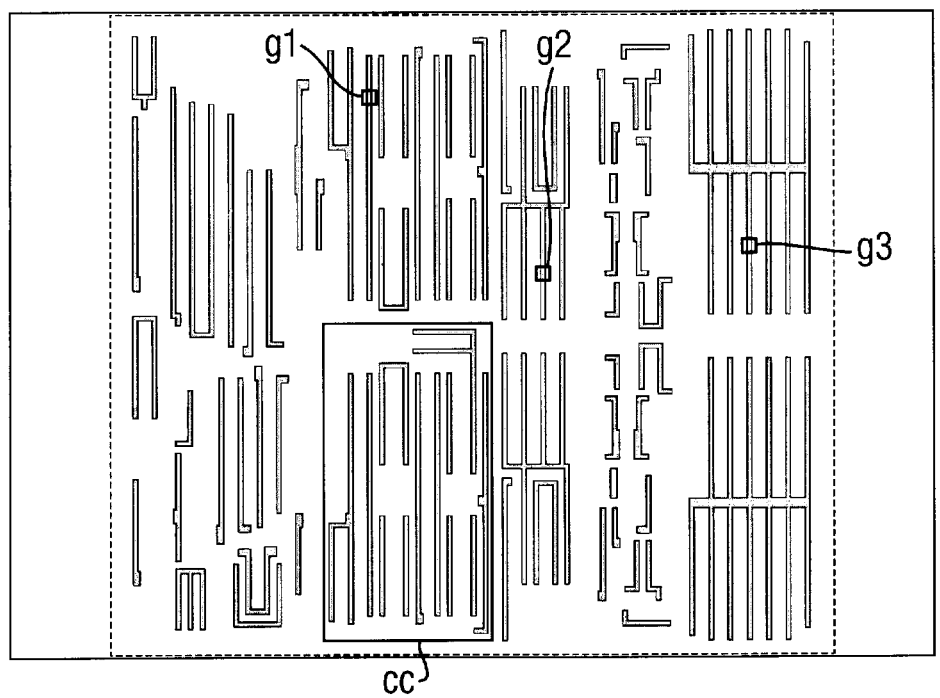
FIG. 12 is an example of a mask pattern with critical gates and cells indicated.

An implementation of the present invention includes selection of cells or particular gates that are critical. These critical features are then processed to determine $J_{tot}$ as described above. In Section 1, it was shown that the illumination configuration is pattern dependent. Therefore, if the pitch does not differ significantly for the critical features, it is possible to create a single illumination configuration which optimizes the process window for all the critical features. In FIG. 12, an example of a circuit with critical gates $g_1$, $g_2$, $g_3$ and a critical cell cc is shown. The diffraction orders of these tagged critical features can be calculated, and by using the theory already described, the optimized illumination configuration can be calculated. After calculating the optimized illumination configuration the process window can be calculated and compared to the process window with other illumination configurations.

Figure 13:
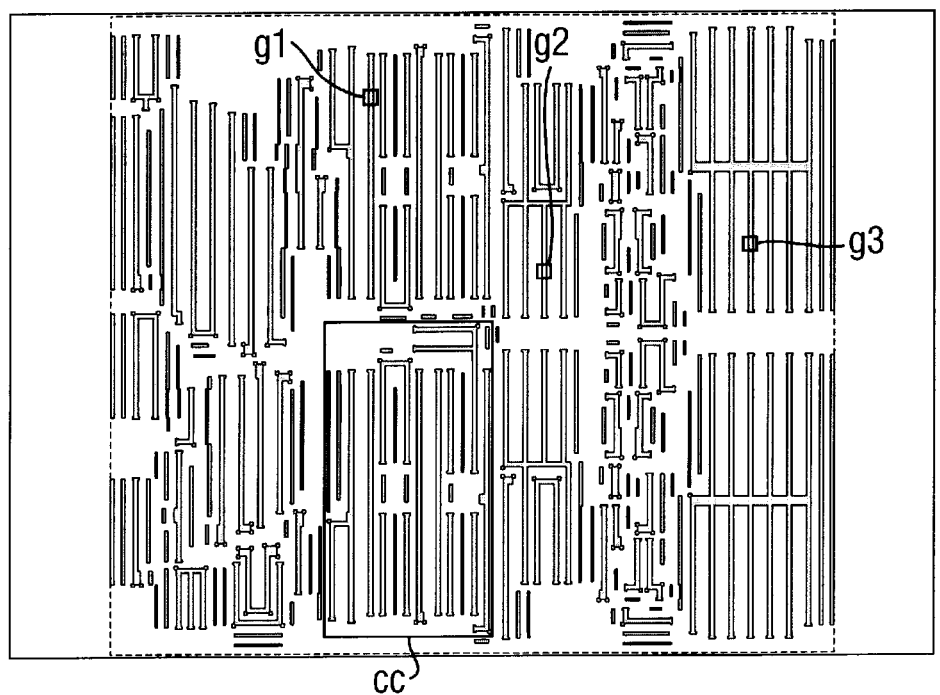
FIG. 13 is the mask pattern of FIG. 12 with assist features added to reduce the number of pitches in the pattern.

Another method of optimizing illumination/pattern interaction is to modify the pattern design with scattering bars. Scattering bars discretize the pitch from a semi-continuous function for an ASIC or logic design. After placing scattering bars, there are fewer pitches. This can be demonstrated in simulation software by placing the scattering bars with an edge-to-edge separation of 0.61$\lambda$/NA. In FIG. 13, the design in FIG. 12 has been modified by adding a plurality of scattering bars. The illumination configuration can then be optimized for the modified design. The process window performance of an illumination configuration optimized for a design with scattering bars can then be compared to the process window of an illumination configuration optimized without scattering bars. Since a design with scattering bars discretizes the pitch, the combination of scattering bars with optimized off axis illumination (OAI) will have the largest possible DOF process window.

Another concept for implementing illumination configuration optimization is through the placing of scattering bars based on space width (SW) considerations. A scattering bar is placed through rule based OPC which rules may be defined by the space width. With simulation software, it should be possible to calculate the probability density function (pdf) of the space width without scattering bars and with scattering bars. The illumination can than be optimized by considering the pdf by modifying $J_{opt\text{-}2D}$ as shown in Equation 16. Assuming that the vertical lines and horizontal lines are infinite, it is also possible to calculate the diffraction orders T(m,n). In Equation 17, the diffraction orders are calculated as a function of m and n where w is the line width, $\tau$ is the intensity transmittance of the reticle, and $P_x$=$SW_x$+w and $P_y$=$SW_y$+w are the pitches in the x and y directions, respectively.

$$J_{opt-2D}(\alpha, \beta, \eta, \xi) = \qquad \text{Eqn. 16}$$

$$J_s(\alpha, \beta) = \sum_{m=-fx_{\max}}^{+fx_{\max}} \sum_{n=-fy_{\max}}^{+fy_{\max}} \int\int dP_x dP_y \, pdf(Py) T(m, n)$$

$$T^*[-(\eta-m), -(\xi-n)] \cdot K\left(\alpha + \frac{m\lambda}{P_x NA}, \beta + \frac{n\lambda}{P_y NA}\right)$$

$$K^*\left(\alpha - (\eta-m)\frac{\lambda}{P_x NA}, \beta - (\xi-n)\frac{\lambda}{P_y NA}\right)$$

Equation 17 is a matrix of four equations for which, in order of presentation, m=n=0; m=0, n≠0; m≠0, n=0; and m≠0, n≠0.

$$T(m, n) = \begin{cases} 1 - w(1 + \sqrt{\tau})\left(\frac{1}{P_x} + \frac{1}{P_y}\right) + \frac{w^2}{P_x P_y}(1 + \sqrt{\tau})^2 \\ \left[1 - \frac{w}{P_x}(1 + \sqrt{\tau})\right](1 + \sqrt{\tau})\left(\frac{P_y}{\pi n}\right)\sin\left(n\frac{\pi w}{P_y}\right) \\ \left[1 - \frac{w}{P_y}(1 + \sqrt{\tau})\right](1 + \sqrt{\tau})\left(\frac{P_x}{\pi m}\right)\sin\left(m\frac{\pi w}{P_x}\right) \\ (1 + \sqrt{\tau})^2 \left(\frac{P_x}{\pi m}\right)\sin\left(m\frac{\pi w}{P_x}\right)\left(\frac{P_y}{\pi n}\right)\sin\left(n\frac{\pi w}{P_y}\right) \end{cases} \quad \text{Eqn. 17}$$

Calculating the optimal illumination configuration with the pdf can present some problems as it implies that some pitches are not as important as others. If all the gates in the pdf are considered to be critical, the pdf should be modified by a weighting factor. This weighting factor is a function of pitch called wf(Px). With this weighting factor, all the critical pitches should be treated the same such that wf(Px)·pdf(Px)=1. This weighting factor should be added to Equation 16 by replacing pdf(Px) in Equation 16 with wf(Px)·pdf(Px). In the case that all of the pitches are critical, the weighting factors will not help to resolve the optimization and it is difficult to create an optimized illumination configuration without modifying the (pattern) design.

Figure 14:
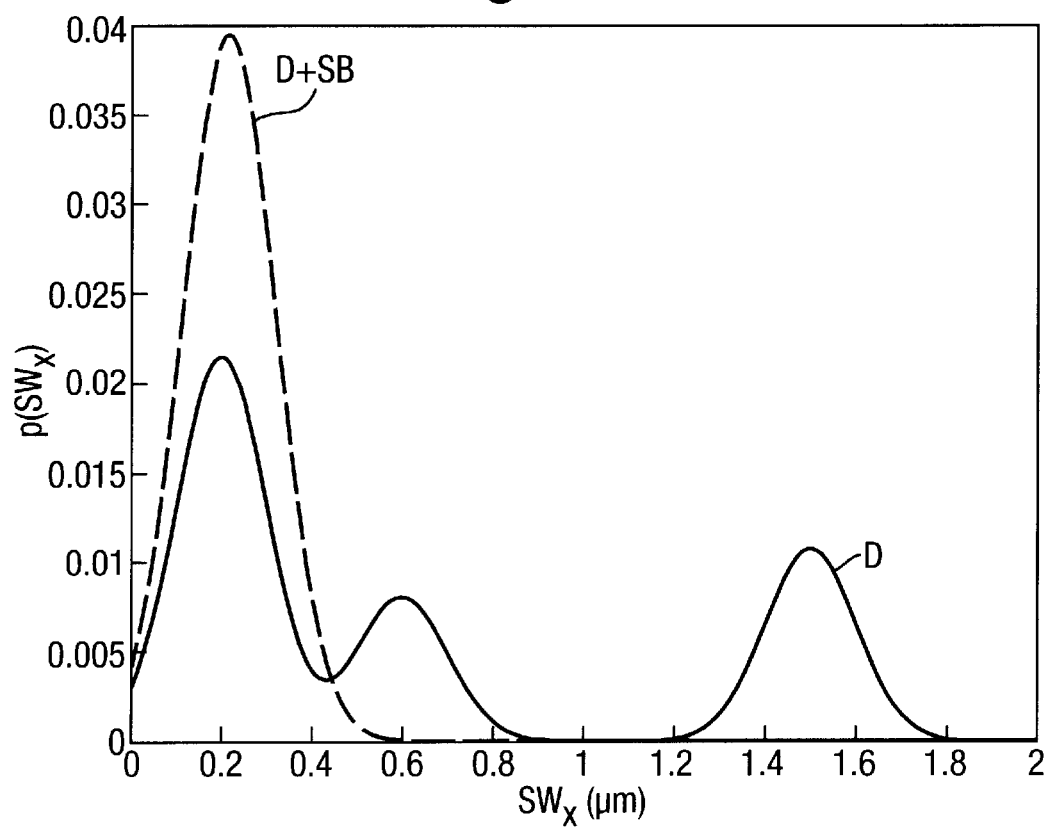
FIG. 14 compares probability density functions of space widths of the mask patterns of FIGS. 12 and 13.

One solution to this problem is to modify the design by adding scattering bars as discussed above. Scattering bars help to reduce pitches for isolated features. Once scattering bars are added to the design, the previously isolated features tend to act like dense features. Thus, scattering bars discretize the pitch from a continuous pdf to a more discrete pdf. FIG. 14 is an example pdf for a logic pattern with features oriented in the y-direction (i.e. "vertical" direction) in which scattering bars have and have not been applied. FIG. 14 shows vertical gate space widths (μm) on the x (horizontal) axis. For the unmodified design, D, without scattering bars, there are three discrete humps in the pdf at space widths of 0.2, 0.6 and 1.5 μm. After the placement of scattering bars, D+SB, the number of pitches has been reduced such that most of the space widths are at dense pitches of 0.2 μm. With this change to the pdf, it is more likely that an illumination configuration can be optimized.

The total illumination configuration for a design with both horizontal (x-direction) and vertical features is the sum of horizontal and vertical illumination configurations. If the illumination configuration is concentrated at $\sigma_{cx}$ for the vertical features and is concentrated at $\sigma_{cy}$ for the horizontal features, the optimal illumination configuration will be a "conventional" quadrupole illumination configuration provided that $\sqrt{2}\sigma_{cx} \leq 1$ and that $\sqrt{2}\sigma_{cy} \leq 1$. Otherwise, this type of analysis will result in a four pole illumination configuration that has been rotated 45°.

The illumination technique presented herein may be extended to account for aberrations. Including aberrations allows an operator to determine which part of the illumination configuration couples to the aberration. The amount of coupling is directly related to sensitivity of the image intensity to the aberration. By understanding this coupling, it may be possible to modify the illumination configuration to minimize the aberration sensitivity of a design.

The projection pupil, K(α,β), for scalar imaging contains the obliquity factor, defocus, and the exponential of the wavefront represented by the Zernike polynomials. This scalar imaging pupil is shown in Equation 18. This pupil can further be divided into two parts, the unaberrated pupil $K_0(\alpha,\beta)$ and the aberrated pupil (the exponential of the wavefront); these two parts are multiplied together as shown in Equation 19.

$$K(\alpha, \beta) = \underbrace{\left[\frac{1 - (\alpha^2 + \beta^2)/M^2}{1 - (\alpha^2 + \beta^2)}\right]^{1/4}}_{obliquity-factor} \quad \text{Eqn. 18}$$

$$\underbrace{\exp\left[-i\frac{2\pi}{\lambda}z\sqrt{1 - \alpha^2 - \beta^2}\right]}_{defocus} \underbrace{\exp\left[-i\frac{2\pi}{\lambda}W(\alpha, \beta)\right]}_{aberrations}$$

$$K(\alpha, \beta) = \underbrace{K_0(\alpha, \beta)}_{unaberrated} \underbrace{\exp\left[-i\frac{2\pi}{\lambda}W(\alpha, \beta)\right]}_{aberrations} \quad \text{Eqn. 19}$$

where $$K_0(\alpha, \beta) = \underbrace{\left[\left[\frac{1 - (\alpha^2 + \beta^2)/M^2}{1 - (\alpha^2 + \beta^2)}\right]\right]^{1/4}}_{obliquity-factor} \underbrace{\exp\left[-i\frac{2\pi}{\lambda}z\sqrt{1 - \alpha^2 - \beta^2}\right]}_{defocus} \quad \text{Eqn. 20}$$

$$W(\alpha, \beta) = \sum_{v=5}^{37} Z_v R_v(\alpha, \beta) \quad \text{Eqn. 21}$$

$$e^x = 1 + x + \frac{x^2}{2!} + \frac{x^3}{3!} + \ldots \cong 1 + x \quad \text{Eqn. 22}$$

From Equation 22, the wavefront can be written as a linear approximation, which is shown in Equation 23. By substituting Equation 23 into Equation 22, the linear approximation for the projection pupil, K(α,β), can be calculated with Equation 24.

$$\exp\left[-i\frac{2\pi}{\lambda}W(\alpha, \beta)\right] \cong 1 - i\frac{2\pi}{\lambda}W(\alpha, \beta) = 1 - i\frac{2\pi}{\lambda}\sum_{v=5}^{37} Z_v R_v(\alpha, \beta) \quad \text{Eqn. 23}$$

$$K(\alpha, \beta) = K_0(\alpha, \beta)\left[1 - i\frac{2\pi}{\lambda}\sum_{v=5}^{37} Z_v R_v(\alpha, \beta)\right] \quad \text{Eqn. 24}$$

Since the TCC is a function of the projection pupil, K(α,β), the linear approximation to the pupil in Equation 24 implies that the TCC can be represented by a linear approximation. This is accomplished by substituting Equation 24 into Equation 1, which results in Equation 25. Once again by neglecting the terms of power 2 or greater, the TCC in Equation 25 can be simplified as shown in Equation 26.

The wavefront, W(α,β), is most often denoted by the summation of Zernike fringe polynomials as shown in Equation 21. Using the linear theory of aberrations, the exponential, $e^x$, can be represented by a Taylor series expansion. The Taylor series expansion is valid for small x, and previous work has shown good agreement for aerial images when $Z_v$ is less than 0.04λ. The Taylor series expansion for $e^x$ is shown in Equation 22. In Equation 22, terms of power 2 or greater have been dropped, which is valid provided that $Z_v$ is less than 0.04 ($0.04^2$=0.0016 and is negligible).

$$TCC(m, n, p, q) \cong \iint\limits_{\sqrt{\alpha^2+\beta^2}<\sigma} J_s(\alpha, \beta) K_0\left(\alpha + \frac{m\lambda}{P_xNA}, \beta + \frac{n\lambda}{P_yNA}\right) \quad \text{Eqn. 25}$$

$$\left[1 - i\frac{2\pi}{\lambda}\sum_{v=5}^{37} Z_v R_v\left(\alpha + \frac{m\lambda}{P_xNA}, \beta + \frac{n\lambda}{P_yNA}\right)\right] \cdot$$

$$K_0^*\left(\alpha - \frac{p\lambda}{P_xNA}, \beta - \frac{q\lambda}{P_yNA}\right)$$

$$\left[1 + i\frac{2\pi}{\lambda}\sum_{v=5}^{37} Z_v R_v\left(\alpha - \frac{p\lambda}{P_xNA}, \beta - \frac{q\lambda}{P_yNA}\right)\right] d\alpha d\beta$$

$$TCC(m, n, p, q) \cong \iint\limits_{\sqrt{\alpha^2+\beta^2}<\sigma} J_s(\alpha, \beta) \quad \text{Eqn. 26}$$

$$K_0\left(\alpha + \frac{m\lambda}{P_xNA}, \beta + \frac{n\lambda}{P_yNA}\right) K_0^*\left(\alpha - \frac{p\lambda}{P_xNA}, \beta - \frac{q\lambda}{P_yNA}\right) \cdot$$

$$\left[1 - i\frac{2\pi}{\lambda}\sum_{v=5}^{37} Z_v R_v\left(\alpha + \frac{m\lambda}{P_xNA}, \beta + \frac{n\lambda}{P_yNA}\right) +\right.$$

$$\left. i\frac{2\pi}{\lambda}\sum_{v=5}^{37} Z_v R_v\left(\alpha - \frac{p\lambda}{P_xNA}, \beta - \frac{q\lambda}{P_yNA}\right)\right] d\alpha d\beta$$

By defining the unaberrated TCC, $TCC_0(m,n,p,q)$, and the aberrated TCC, $TCC_v(m,n,p,q)$, in Equations 27 and 28, respectively, the TCC can be represented by a linear function of $TCC_0$ and $TCC_v$ as shown in Equation 29.

$$TCC_0(m, n, p, q) = \iint\limits_{\sqrt{\alpha^2+\beta^2}<\sigma} J_s(\alpha, \beta) \quad \text{Eqn. 27}$$

$$K_0\left(\alpha + \frac{m\lambda}{P_xNA}, \beta + \frac{n\lambda}{P_yNA}\right) K_0^*\left(\alpha - \frac{p\lambda}{P_xNA}, \beta - \frac{q\lambda}{P_yNA}\right) d\alpha d\beta$$

$$TCC_v(m, n, p, q) = \quad \text{Eqn. 28}$$

$$-i\frac{2\pi}{\lambda} \iint\limits_{\sqrt{\alpha^2+\beta^2}<\sigma} J_s(\alpha, \beta) K_0\left(\alpha + \frac{m\lambda}{P_xNA}, \beta + \frac{n\lambda}{P_yNA}\right)$$

$$TCC(m, n, p, q) \cong TCC_0(m, n, p, q) + \quad \text{Eqn. 29}$$

$$\sum_{v=5}^{37} Z_v[TCC_v(m, n, p, q) + TCC_v^*(-p, -q, -m, -n)]$$

Since the TCC can be constructed as a linear approximation as shown in Equation 29, $J_{opt}$ can also be written as a linear approximation. The linear approximation to $J_{opt}$ is derived in Equation 30 by using Equation 8 for $J_{opt}$ and by following the methodology for the linear approximation of the TCC as outlined in Equations 18 through 29.

$$J_{opt}(\alpha, \beta, m, n, p, q) \cong J_s(\alpha, \beta)T(m, n)T^*(-p, -q) \quad \text{Eqn. 30}$$

$$K_0\left(\alpha + \frac{m\lambda}{P_xNA}, \beta - \frac{n\lambda}{P_yNA}\right) K_0^*\left(\alpha - \frac{p\lambda}{P_xNA}, \beta - \frac{q\lambda}{P_yNA}\right) \cdot$$

$$\left[1 - i\frac{2\pi}{\lambda}\sum_{v=5}^{37} Z_v R_v\left(\alpha + \frac{m\lambda}{P_xNA}, \beta + \frac{n\lambda}{P_yNA}\right) +\right.$$

$$\left. i\frac{2\pi}{\lambda}\sum_{v=5}^{37} Z_v R_v\left(\alpha - \frac{p\lambda}{P_xNA}, \beta - \frac{q\lambda}{P_yNA}\right)\right] d\alpha d\beta$$

Equation 30 for $J_{opt}$ can then be divided into a summation of the unaberrated $J_{opt0}$ with the aberrated $J_{optv}$ as shown in Equation 33. The definition of $J_{opt0}$ and $J_{optv}$ are shown in Equations 31 and 32, respectively.

$$J_{opt0}(\alpha, \beta, m, n, p, q) = \quad \text{Eqn. 31}$$

$$J_s(\alpha, \beta)K_0\left(\alpha + \frac{m\lambda}{P_xNA}, \beta + \frac{n\lambda}{P_yNA}\right)K_0^*\left(\alpha - \frac{p\lambda}{P_xNA}, \beta - \frac{q\lambda}{P_yNA}\right)$$

$$J_{optv}(\alpha, \beta, m, n, p, q) = -i\frac{2\pi}{\lambda}J_s(\alpha, \beta) \quad \text{Eqn. 32}$$

$$K_0\left(\alpha + \frac{m\lambda}{P_xNA}, \beta + \frac{n\lambda}{P_yNA}\right) \cdot K_0^*\left(\alpha - \frac{p\lambda}{P_xNA}, \beta - \frac{q\lambda}{P_yNA}\right)$$

$$R_v\left(\alpha + \frac{m\lambda}{P_xNA}, \beta + \frac{n\lambda}{P_yNA}\right)$$

Equation 32 describes the portion of the illumination configuration which couples to a particular aberration. The amount of coupling affects the image intensity and helps to provide an understanding of aberration sensitivity to illumination. By combining Equations 31 and 32, $J_{opt}$ can be written as a linear approximation.

$$J_{opt}(\alpha, \beta, m, n, p, q) \cong J_{opt0}(\alpha, \beta, m, n, p, q) + \quad \text{Eqn. 33}$$

$$\sum_{v=5}^{37} Z_v[J_{optv}(\alpha, \beta, m, n, p, q) + J_{optv}^*(\alpha, \beta, -p, -q, -m, -n)]$$

In another aspect of the present invention, weighting factors can be introduced to maximize or to minimize a response to a particular metric including, for example, depth of focus (DOF), image log slope (ILS), image slope (IS), or aberration sensitivity. The optimal $J_{tot}$ of Equation 15 can be modified to include these weighting factors as shown in Equation 34.

$$J_{tot}(\alpha, \beta) = \quad \text{Eqn. 34}$$

$$\sum_m \sum_n \sum_p \sum_q w(\alpha, \beta, m, n, p, q) J_{opt}(\alpha, \beta, m, n, p, q)$$

In general, photoresists react in proportion to the logarithm of the intensity of the light impinging thereon. As the intensity, and therefore the logarithm of the intensity, increases, the feature will be printed into the resist with better fidelity (i.e. improved resist profile and improved process window). Therefore, it is desirable to maximize the logarithmic change in intensity (ILS). The ILS is defined in Equation 35.

$$ILS \propto \frac{\partial \ln I}{\partial x} = \frac{1}{I}\frac{\partial I}{\partial x} \quad \text{Eqn. 35}$$

Since the derivative of the intensity changes faster than the inverse of intensity, Equation 35 will increase more by increasing the derivative of the intensity. The intensity can be calculated from Equation 3 and the derivative of the intensity with respect to x is defined in Equation 36. The derivative with respect to x results in the weighting function, $w_x$, as shown in Equation 37. Likewise, a weighting function $w_y$ can be defined with respect to y as shown in Equation 38.

$$\frac{\partial I(x,y)}{\partial x} = \sum_m \sum_n \sum_p \sum_q i\frac{2\pi}{P_x}(m+p)e^{ix\left[\frac{2\pi}{P_x}(m+p)\right]}e^{iy\left[\frac{2\pi}{P_y}(n+q)\right]}DOCC(m,n,p,q) \quad \text{Eqn. 36}$$

$$= \sum_m \sum_n \sum_p \sum_q w_x(m,p)e^{ix\left[\frac{2\pi}{P_x}(m+p)\right]}e^{iy\left[\frac{2\pi}{P_y}(n+q)\right]}DOCC(m,n,p,q)$$

$$w_x = i\frac{2\pi}{P_x}(m+p) \quad \text{Eqn. 37}$$

$$w_y = i\frac{2\pi}{P_y}(n+q) \quad \text{Eqn. 38}$$

Since pattern features and intensity features are two dimensional, the norm of the gradient may be used to indicate the change in intensity with respect to position. The norm of the intensity gradient is defined in Equation 39. This allows us to define a weighting function to calculate $J_{tot}$ in Equation 34. The weighting function to maximize the image log slope is defined by Equation 40.

$$w_{ILS}(m,n,p,q) = 2\pi\sqrt{\left(\frac{m+p}{P_x}\right)^2 + \left(\frac{n+q}{P_y}\right)^2} \quad \text{Eqn. 40}$$

Equation 40 shows that when m+p=0 and n+q=0, the weighting function becomes 0. When m+p=0 and n+q=0, these orders contribute nothing to image modulation and reflect DC contributions to the image. Furthermore, $w_{ILS}$ increases as m+p and n+q increase. This implies that higher order diffraction order terms are more highly weighted and contribute more to ILS.

In addition to maximizing ILS, the depth of focus of the process will increase if the ILS is improved such that the intensity response to focus is minimized. The focus is accounted for by the pupil $K(\alpha,\beta)$. The pupil, $K(\alpha,\beta)$, is shown in Equation 41, where focus is denoted z. Equation 41 can be divided into two terms, terms dependant on z (the defocus term) and terms independent of z (the non-defocus term), as shown in Equation 42.

$$K(\alpha,\beta) = \underbrace{\left[\frac{1-(\alpha^2+\beta^2)/M^2}{1-(\alpha^2+\beta^2)}\right]^{1/4}}_{obliliquity\text{-}factor} \quad \text{Eqn. 41}$$

$$\underbrace{\exp\left[-i\frac{2\pi}{\lambda}z\sqrt{1-\alpha^2-\beta^2}\right]}_{defocus}\underbrace{\exp\left[-i\frac{2\pi}{\lambda}W(\alpha,\beta)\right]}_{aberrations}$$

$$K(\alpha,\beta) = \quad \text{Eqn. 42}$$

$$\underbrace{K_{nd}(\alpha,\beta)}_{non\text{-}defocused}\underbrace{\exp\left[-i\frac{2\pi}{\lambda}z\sqrt{1-\alpha^2-\beta^2}\right]}_{defocus} = K_{nd}(\alpha,\beta)K_d(\alpha,\beta)$$

The variation in intensity due to focus, z, can be minimized by setting the derivative of intensity with respect to z to zero. By substituting Equation 42 into Equations 1 through 3, a cost function $f(\alpha,\beta,z)$ can be defined as shown in Equation 43 which is the cost function of the intensity imaging terms which depend on z.

$$f(\alpha,\beta,z) = \quad \text{Eqn. 43}$$

$$K_d\left(\alpha+\frac{m\lambda}{P_xNA},\beta+\frac{n\lambda}{P_yNA}\right)K_d^*\left(\alpha-\frac{p\lambda}{P_xNA},\beta-\frac{q\lambda}{P_yNA}\right)$$

The cost function, $f(\alpha,\beta,z)$, is in turn minimized when $g(\alpha,\beta,m,n,p,q)$ equals zero (see Equation 44, below). In Equation 44 the phase terms have been removed as the derivative with respect to z equals zero only when the magnitude terms equal zero. When $g(\alpha,\beta,m,n,p,q)$ is zero, the areas $(\alpha,\beta)$ of the pupil for a given order (m,n,p,q) are minimally sensitive to focus. These are the most desired areas of the pupil for constructing the illumination configuration. A weighting function, $w_{focus}(\alpha,\beta,m,n,p,q)$, is defined in Equation 45. This weighting function is equal to 1 for areas least sensitive to focus and is equal 0 for areas most sensitive to focus. A new weighting function which maximizes ILS through focus can then be defined by Equation 46 and used to modify the illumination configuration.

$$g(\alpha,\beta,n,n,p,q) = \quad \text{Eqn. 44}$$

$$\frac{\partial}{\partial z}f(\alpha,\beta,z) = \left[-i\frac{2\pi}{\lambda}\sqrt{1-\left(\alpha+\frac{m\lambda}{P_xNA}\right)^2 - \left(\beta+\frac{n\lambda}{P_yNA}\right)^2} + \right.$$

$$\left. i\frac{2\pi}{\lambda}\sqrt{1-\left(\alpha-\frac{p\lambda}{P_xNA}\right)^2 - \left(\beta-\frac{q\lambda}{P_yNA}\right)^2}\right]$$

$$w_{focus}(\alpha,\beta,m,n,p,q) = 1 - |g(\alpha,\beta,m,n,p,q)| \quad \text{Eqn. 45}$$

$$w(\alpha,\beta,m,n,p,q) = w_{ILS}(m,n,p,q)w_{focus}(\alpha,\beta,m,n,p,q) \quad \text{Eqn. 46}$$

The above methodology allows the sensitivity of the intensity to be minimized to the influence of focus, an aberration. Since the impact of focus on intensity can be minimized, the impact of intensity can be minimized to a specific aberration. This is desirable for certain patterns which demonstrate a high sensitivity to a particular aberration. The projection pupil in Equation 19 can be written as an unaberrated term, $K_0(\alpha,\beta)$, multiplied by an aberrated term, $K_a(\alpha,\beta)$ as shown in Equation 47.

$$K(\alpha,\beta) = K_0(\alpha,\beta)K_a(\alpha,\beta) \quad \text{Eqn. 47}$$

The sensitivity of the intensity to a particular aberration $Z_i$ can be minimized by setting the derivative of the intensity with respect to $Z_i$ to zero. By substituting Equation 47 into Equations 1 through 3 and taking the derivative of the intensity, the aberration sensitivity is minimized when $h(\alpha, \beta, m, n, p, q)$ in Equation 48 is equal to zero.

$$\frac{\partial}{\partial Z_i} I(x, y) =$$  Eqn. 48

$$0 \Rightarrow h(\alpha, \beta, m, n, p, q) = K_a\left(\alpha + \frac{m\lambda}{P_xNA}, \beta + \frac{n\lambda}{P_yNA}\right)\frac{\partial}{\partial Z_i}$$

$$K_a^*\left(\alpha - \frac{p\lambda}{P_xNA}, \beta - \frac{q\lambda}{P_yNA}\right) + \frac{\partial}{\partial Z_i} K_a\left(\alpha + \frac{m\lambda}{P_xNA},\right.$$

$$\left.\beta + \frac{n\lambda}{P_yNA}\right) K_a^*\left(\alpha - \frac{p\lambda}{P_xNA}, \beta - \frac{q\lambda}{P_yNA}\right) = 0$$

$$h(\alpha, \beta, m, n, p, q) = \left[R_i\left(\alpha - \frac{p\lambda}{P_xNA}, \beta - \frac{q\lambda}{P_yNA}\right) - \right.$$  Eqn. 49

$$\left. R_i\left(\alpha + \frac{m\lambda}{P_xNA}, \beta + \frac{n\lambda}{P_yNA}\right)\right] = 0$$

Equation 48 may be simplified and written as Equation 49. A weighting function $w_{ab}(\alpha,\beta,m,n,p,q)$ is defined in Equation 50, which equates to 1 for areas $(\alpha,\beta)$ of the pupil that are least sensitive to $Z_i$ and to 0 for areas most sensitive to $Z_i$.

$$w_{ab}(\alpha, \beta, m, n, p, q) = 1 - \frac{1}{2}|h(\alpha, \beta, m, n, p, q)|$$  Eqn. 50

The weighting function to minimize ILS sensitivity to a particular aberration, $Z_i$, can then be defined in Equation 51. Furthermore, a weighting function to minimize ILS sensitivity to a particular aberration, $Z_i$, and to maximize ILS through focus can also be defined in Equation 52. Either of these equations can be substituted into Equation 34 to calculate the illuminator with the optimal response to a given metric.

$$w(\alpha,\beta,m,n,p,q)=w_{NILS}(m,n,p,q)W_{ab}(\alpha,\beta,m,n,p,q)$$  Eqn. 51

$$w(\alpha,\beta,m,n,p,q)=w_{NILS}(m,n,p,q)w_{focus}(\alpha,\beta,m,n,p,q)w_{ab}(\alpha,\beta,m,n,p,q)$$  Eqn. 52

Figure 15:
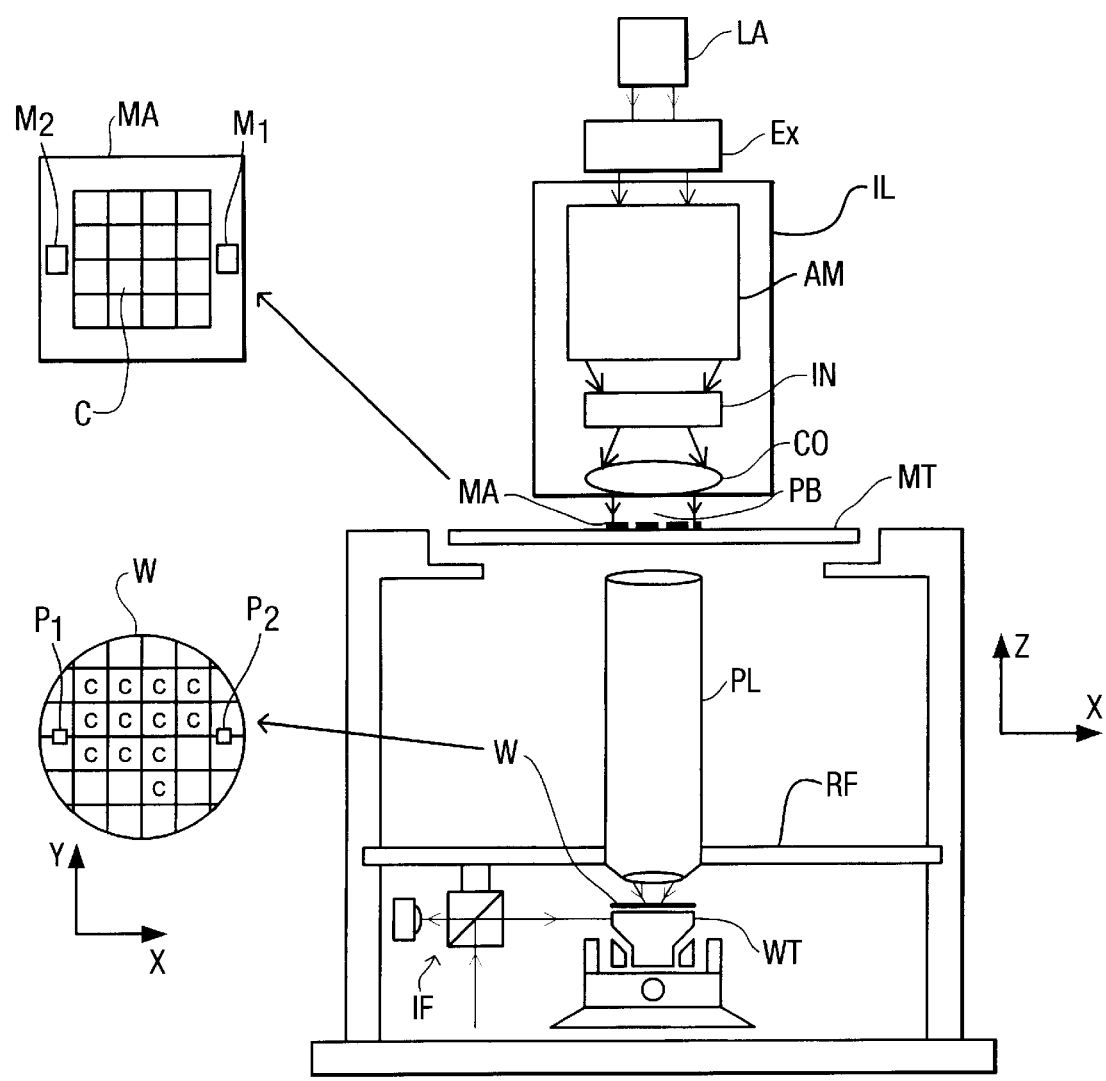
FIG. 15 is a schematic representation of an apparatus for microphotolithography.

FIG. 15 is a schematic representation of an example of a lithography apparatus for use according to the present invention. The apparatus includes a radiation system. The radiation system is made up of a lamp LA (which may be an excimer laser, for example) and an illumination system which may comprise beam shaping optics EX, an integrator IN, and a condenser lens CO, for example. The radiation system supplies a projection beam PB of radiation. For example, the radiation system may provide ultraviolet, deep ultraviolet or extreme ultraviolet radiation. In general, the radiation system may also provide soft x-ray or other forms of radiation.

A first object table, or mask table MT holds a mask MA. The mask MA includes a pattern area C which contains the mask pattern to be imaged. The mask table MT is movable relative to the projection beam PB so that different portions of the mask may be irradiated. Alignment marks $M_1$ and $M_2$ are used for determining whether the mask is properly aligned with the substrate, or wafer, W.

A projection system PL projects the projection beam PB onto the wafer W. The wafer W includes two alignment marks $P_1$ and $P_2$ which are aligned with the marks $M_1$ and $M_2$ prior to beginning imaging. The wafer W is supported by a substrate table WT which is moveable relative to the projection beam for exposing different parts of the wafer W; in this way, the mask pattern C may be imaged onto different target portions c of the wafer W. An interferometric position monitor IF is used to insure that the wafer table WT is in the correct position relative to the position of the mask table MT.

While the invention has been described in connection with particular embodiments, it is to be understood that the invention is not limited to the disclosed embodiments, but on the contrary it is intended to cover various modifications and equivalent arrangement included within the scope of the claims which follow.

What is claimed is:

1. A method of optimizing an illumination profile for a selected patterning structure pattern, comprising:
   defining a transmission cross coefficient function for an optical system including an illuminator and the selected patterning structure pattern;
   determining relative relevance to imaging of diffraction orders based on the selected pattern; and
   calculating an optimized illumination configuration from the transmission cross coefficient function, weighting regions of the illumination configuration based on the relative relevance to imaging of the diffraction orders.

2. A method as in claim 1, wherein the determining further comprises:
   determining a characteristic pitch of the selected mask pattern.

3. A method as in claim 2, further comprising:
   identifying a critical region of the selected pattern prior to determining the characteristic pitch,
   wherein determining the characteristic pitch for the selected pattern is performed by determining the characteristic pitch for the critical region.

4. A method as in claim 3, wherein the identifying further comprises identifying a plurality of critical regions and wherein determining the characteristic pitch for the critical region includes:
   comparing a pitch of each identified critical region; and
   if the pitch of each identified region is substantially equal, determining the characteristic pitch for the critical region to be equal to the characteristic pitch of one of the identified regions.

5. A method as in claim 1, further comprising weighting regions of the illuminator configuration based on a selected optimized metric selected from the group consisting of depth of focus, end-of-line, image log slope (ILS), image slope (IS), and aberration sensitivity.

6. A method as in claim 1, further comprising:
   identifying a plurality of critical regions;
   determining a pitch of each of the identified critical regions; and
   calculating optimized illumination configurations from the transmission cross coefficient function, weighing orders based on relevance to imaging of diffraction orders for each critical region, and
   wherein calculating an optimized illumination configuration further comprises calculating a composite optimized illumination configuration based on the calculated optimized illumination configuration for each critical region.

7. A method as in claim 1, further comprising:
   modifying the selected pattern by optical proximity correction techniques to reduce a total number of different pitches in the mask pattern.

8. A method as in claim 7, wherein the modifying further comprises addition of sub-resolution features to the selected mask pattern.

9. A method as in claim 7, wherein the modifying and calculating are iterated.

10. A device manufacturing method comprising:

projecting a patterned beam of radiation onto a target portion of a layer of radiation-sensitive material on a substrate, wherein, prior to impinging the substrate, the cross-sectional intensity distribution in the projection beam optimized using a method according to claim 1.

11. A method as in claim 10 wherein the optical proximity correction further comprises addition of sub-resolution features selected to modify a continuous probability density function of the space width of the selected mask design such that the modified probability density function has an increased discretization.

12. A machine readable medium encoded with machine executable instructions for optimizing an illumination profile according to a method comprising:

defining a transmission cross coefficient function for an optical system including an illuminator and the selected patterning structure pattern;

determining relative relevance to imaging of diffraction orders based on the selected pattern; and calculating an optimized illumination configuration from the transmission cross coefficient function, weighting regions of the illumination configuration based on the relative relevance to imaging of the diffraction orders.

13. A lithographic projection apparatus comprising:

an illumination system to provide a projection beam of radiation;

a support structure to support patterning structure which can be used to pattern the projection beam according to a desired pattern;

a substrate table to hold a substrate;

a projection system to project the patterned beam onto a target portion of the substrate, wherein the apparatus additionally comprises:

a processor to define a transmission cross coefficient function for the illuminator and the patterning structure, to determine relative relevance to imaging of diffraction orders based on the pattern produced by the patterning structure, and to calculate an optimized illumination configuration from the transmission cross coefficient function, to weigh regions of the illumination configuration based on the relative relevance to imaging of the diffraction orders; and a selectably variable beam controller that is adapted to modify the cross-sectional intensity distribution in the projection beam exiting the illumination system in accordance with the illumination configuration calculated by the processor.

14. A method of optimizing a selected mask design comprising:

identifying critical features of the selected mask design;

determining an optimized illumination profile based on diffraction orders of the critical features; and modifying the selected mask design by use of optical proximity correction techniques which are selected to reduce a number of pitches present in the selected mask design.

15. A method as in claim 14 wherein said determining an optimized illumination profile further comprises:

defining a transmission cross coefficient function for an optical system including an illuminator and the selected mask design;

determining relative relevance to imaging of diffraction orders based on the selected mask design; and calculating an optimized illumination configuration from the transmission cross coefficient function, weighting regions of the illumination configuration based on the relative relevance to imaging of the diffraction orders.

16. A machine readable medium encoded with machine executable instructions for optimizing an illumination profile according to a method comprising:

identifying critical features of the selected mask design;

determining an optimized illumination profile based on diffraction orders of the critical features; and modifying the selected mask design by use of optical proximity correction techniques which are selected to reduce a number of pitches present in the selected mask design.

* * * * *

UNITED STATES PATENT AND TRADEMARK OFFICE
CERTIFICATE OF CORRECTION

PATENT NO. : 6,871,337 B2
DATED : March 22, 2005
INVENTOR(S) : Socha

It is certified that error appears in the above-identified patent and that said Letters Patent is hereby corrected as shown below:

Column 22,
Line 22, delete "selected mask" and replace with -- selected patterning structure --.
Line 34, delete "mask" and replace with -- selected patterning structure --.

Column 23,
Line 4, after "substrate," change "the" to -- a --.
Line 6, after "beam" insert -- is --.
Line 7, replace "the" with -- an --.
Line 11, replace "the" with -- a --.
Line 38, delete "illuminator" and replace with -- illumination system --.

Column 24,
Line 34, delete "the" and replace with -- a --.

Signed and Sealed this

Thirty-first Day of January, 2006

JON W. DUDAS
*Director of the United States Patent and Trademark Office*